(12) United States Patent
Kondo

(10) Patent No.: US 10,360,974 B2
(45) Date of Patent: Jul. 23, 2019

(54) NON-VOLATILE SEMICONDUCTOR MEMORY IN WHICH DATA WRITING TO CELL GROUPS IS CONTROLLED USING PLURAL PROGRAM PULSES

(71) Applicant: Toshiba Memory Corporation, Minato-ku (JP)

(72) Inventor: Shigeo Kondo, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/915,506

(22) Filed: Mar. 8, 2018

(65) Prior Publication Data

US 2019/0088313 A1 Mar. 21, 2019

(30) Foreign Application Priority Data

Sep. 21, 2017 (JP) ................................. 2017-181407

(51) Int. Cl.
| | | |
|---|---|---|
| *G11C 16/34* | (2006.01) |
| *G11C 16/10* | (2006.01) |
| *G11C 11/56* | (2006.01) |
| G11C 16/04 | (2006.01) |
| G11C 16/26 | (2006.01) |
| G11C 16/14 | (2006.01) |

(52) U.S. Cl.
CPC ...... *G11C 11/5628* (2013.01); *G11C 11/5635* (2013.01); *G11C 11/5642* (2013.01); *G11C 11/5671* (2013.01); *G11C 16/34* (2013.01); *G11C 16/3459* (2013.01); *G11C 16/0483* (2013.01); *G11C 16/10* (2013.01); *G11C 16/14* (2013.01); *G11C 16/26* (2013.01); *G11C 2211/5621* (2013.01)

(58) Field of Classification Search
CPC ...... G11C 16/34; G11C 16/3459; G11C 16/10
USPC .................................... 365/185.28, 185.22
See application file for complete search history.

(56) References Cited

U.S. PATENT DOCUMENTS

| | | | |
|---|---|---|---|
| 7,492,641 B2 | 2/2009 | Hosono et al. | |
| 8,837,223 B2 | 9/2014 | Sakamoto et al. | |
| 8,971,128 B2* | 3/2015 | Chin | G11C 11/5628 365/185.03 |
| 9,552,883 B1* | 1/2017 | Jung | G11C 16/12 |
| 2013/0235666 A1 | 9/2013 | Sakamoto et al. | |

FOREIGN PATENT DOCUMENTS

| | | |
|---|---|---|
| JP | 2007-004861 | 1/2007 |
| JP | 2013-200924 | 10/2013 |
| WO | WO 2015/033417 A1 | 3/2015 |

* cited by examiner

*Primary Examiner* — Son L Mai
(74) *Attorney, Agent, or Firm* — Oblon, McClelland, Maier & Neustadt, L.L.P.

(57) ABSTRACT

According to one embodiment, a semiconductor memory of an embodiment includes memory cells, a word line, bit lines, and a controller. The word line is coupled to a plurality of memory cells. The plurality of bit lines are respectively coupled to the plurality of memory cells. The controller executes a first write, and classifies a plurality of memory cells to which the second data should be written into a plurality of subgroups in accordance with a result of the first write, and after the classification, the controller executes a second write that includes a first program loop.

20 Claims, 25 Drawing Sheets

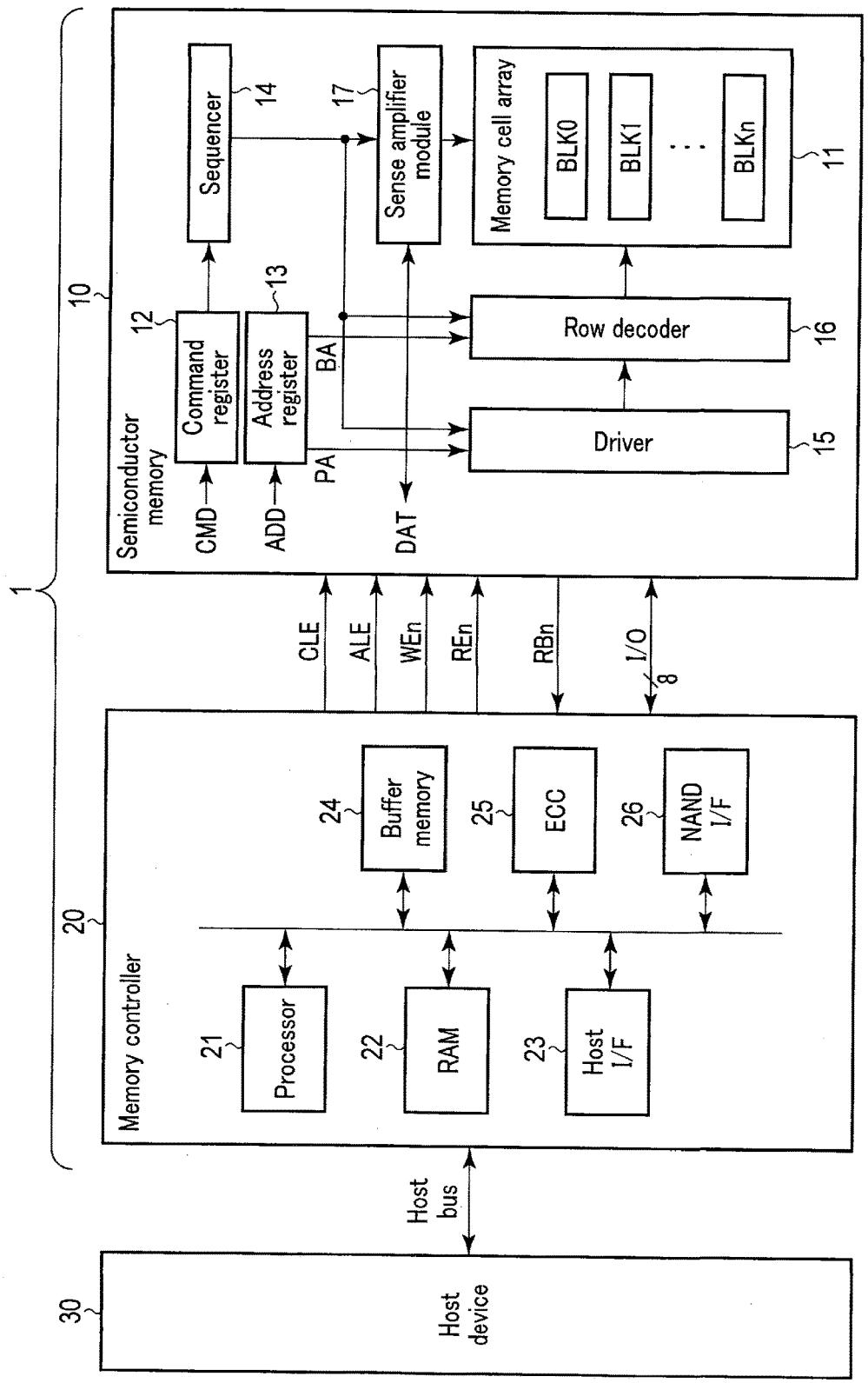
F I G. 1

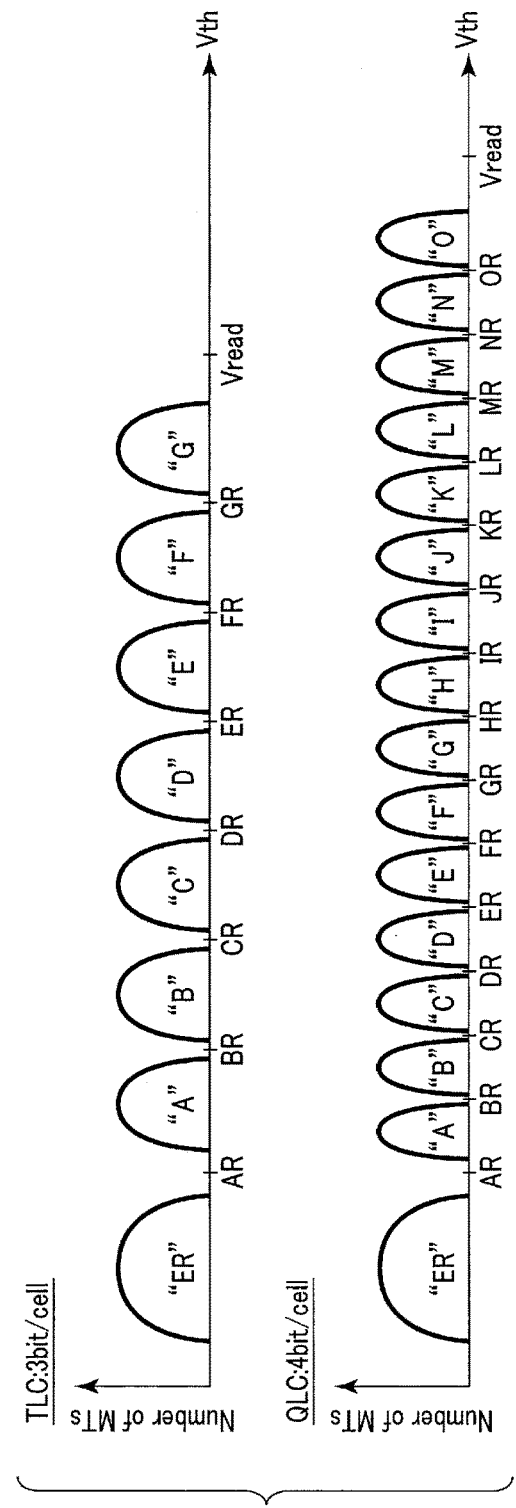
F I G. 3

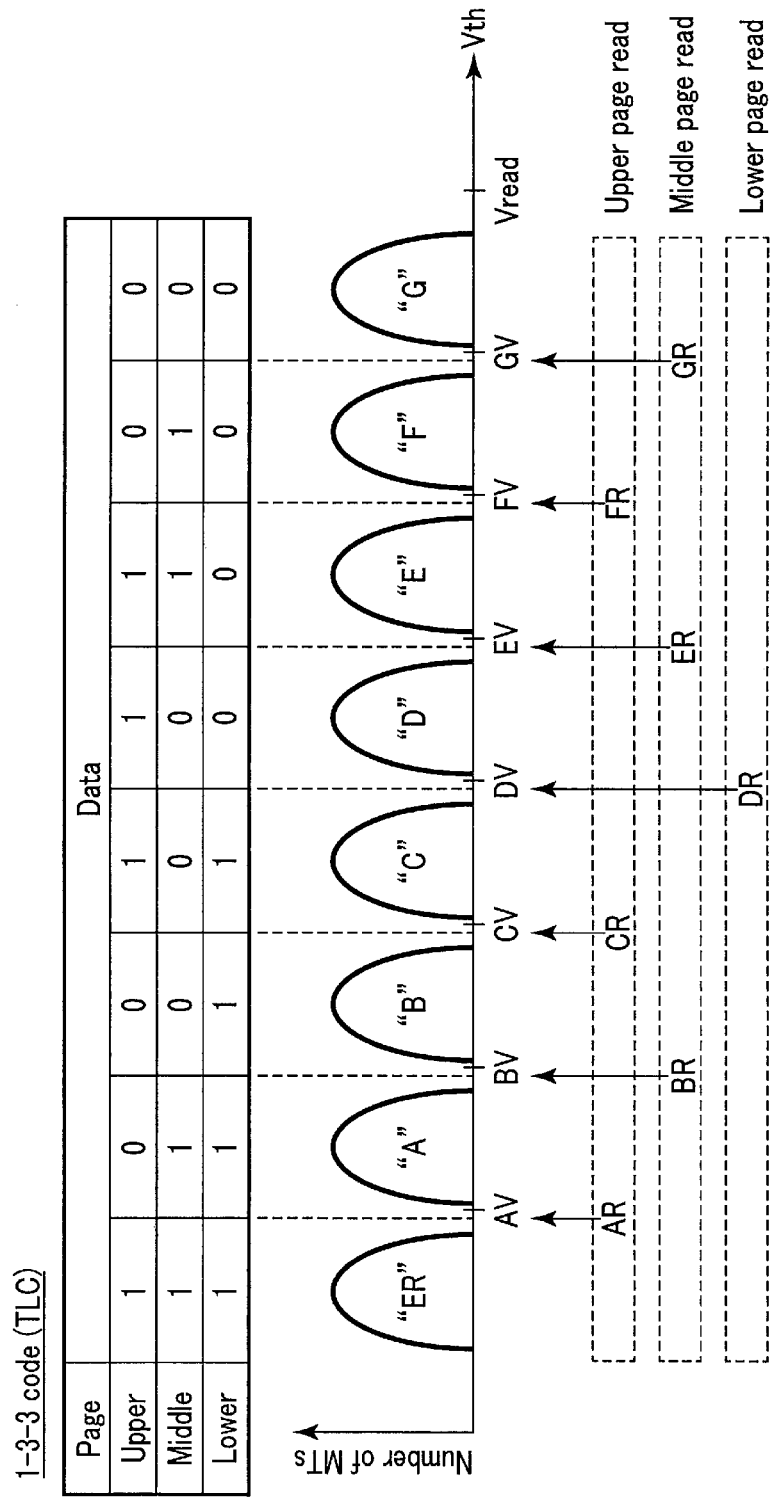
F I G. 4

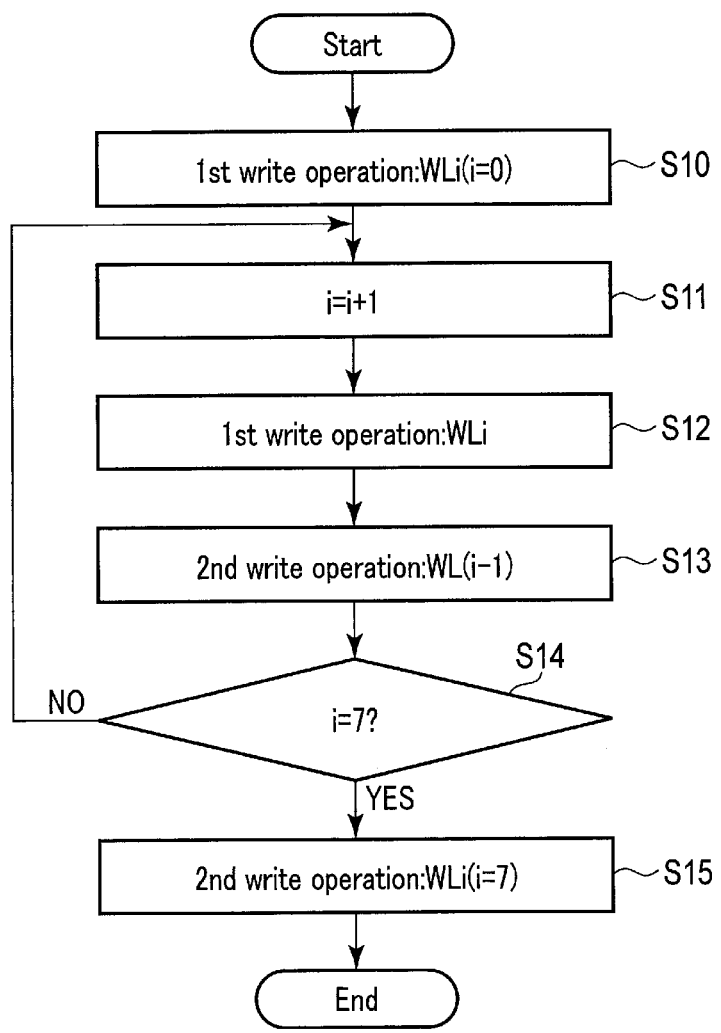
F I G. 10

Second write operation ("D" programming)

(1) 1st group(Vth>DIV)

(2) 2nd group(Vth≦DIV)

Second write operation ("C" programming)

(1) 1st group(Vth>DIV)

(2) 2nd group(Vth≦DIV)

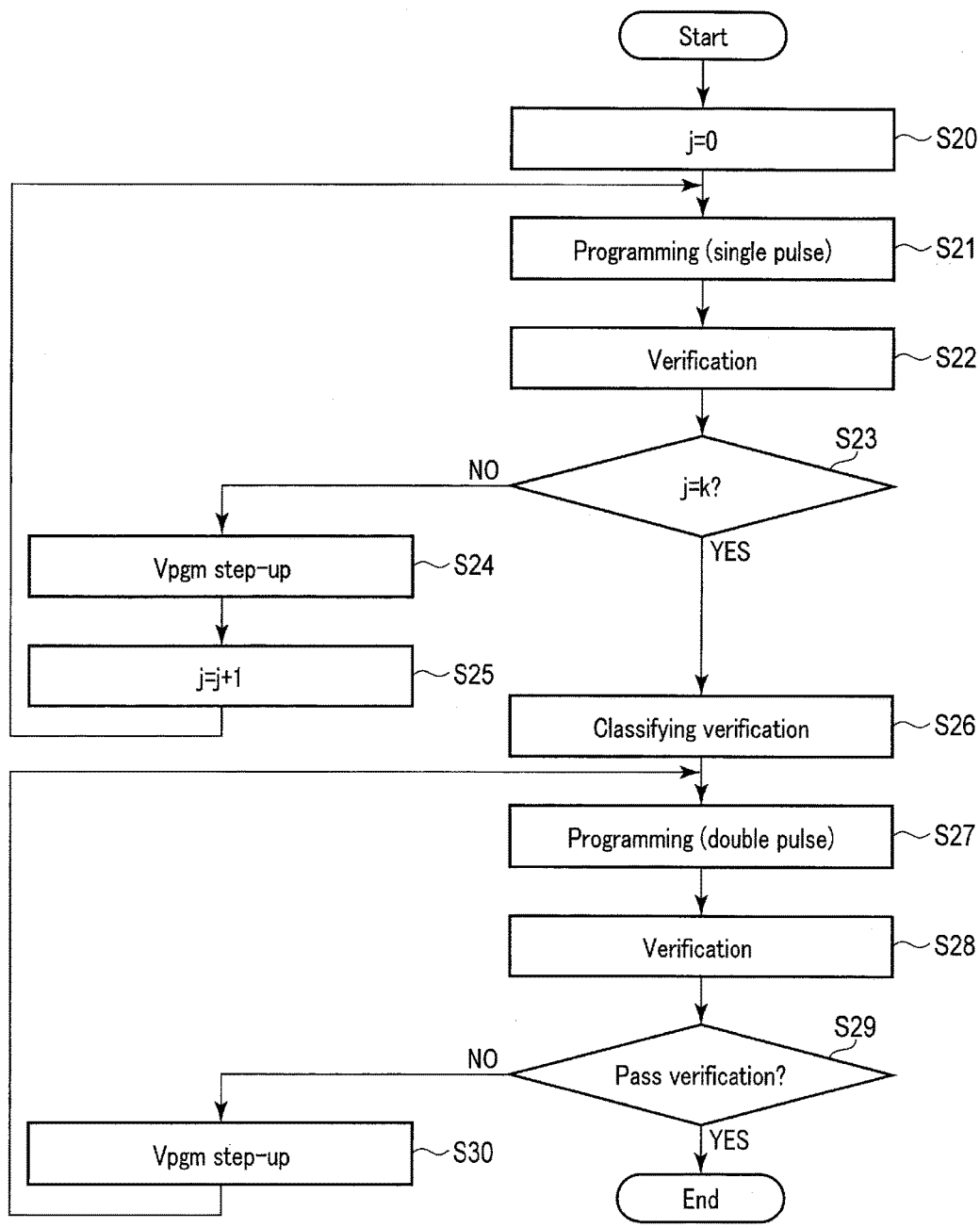
F I G. 16

Third write operation ("D" programming: If Vth > AV in more than half of the cells)

(1) 1st group(Vth>AV)

(2) 2nd group(Vth≦AV)

NON-VOLATILE SEMICONDUCTOR MEMORY IN WHICH DATA WRITING TO CELL GROUPS IS CONTROLLED USING PLURAL PROGRAM PULSES

CROSS-REFERENCE TO RELATED APPLICATIONS

This application is based upon and claims the benefit of priority from Japanese Patent Application No. 2017-181407, filed Sep. 21, 2017, the entire contents of which are incorporated herein by reference.

FIELD

Embodiments described herein relate generally to a semiconductor memory.

BACKGROUND

A NAND type flash memory as a semiconductor memory device is known.

BRIEF DESCRIPTION OF THE DRAWINGS

FIG. 1 is a block diagram showing a configuration example of a memory system that includes a semiconductor memory according to a first embodiment.

FIG. 3 is a diagram showing an example of threshold distributions of memory cell transistors according to the first embodiment.

FIG. 4 is a diagram showing an example of data allocation for the threshold distributions of the memory cell transistors according to the first embodiment.

FIG. 10 shows an example of a flow chart of a write operation in the memory system according to the first embodiment.

FIG. 16 shows an example of a flow chart of a third write operation in a semiconductor memory according to a third embodiment.

DETAILED DESCRIPTION

Figure 2:
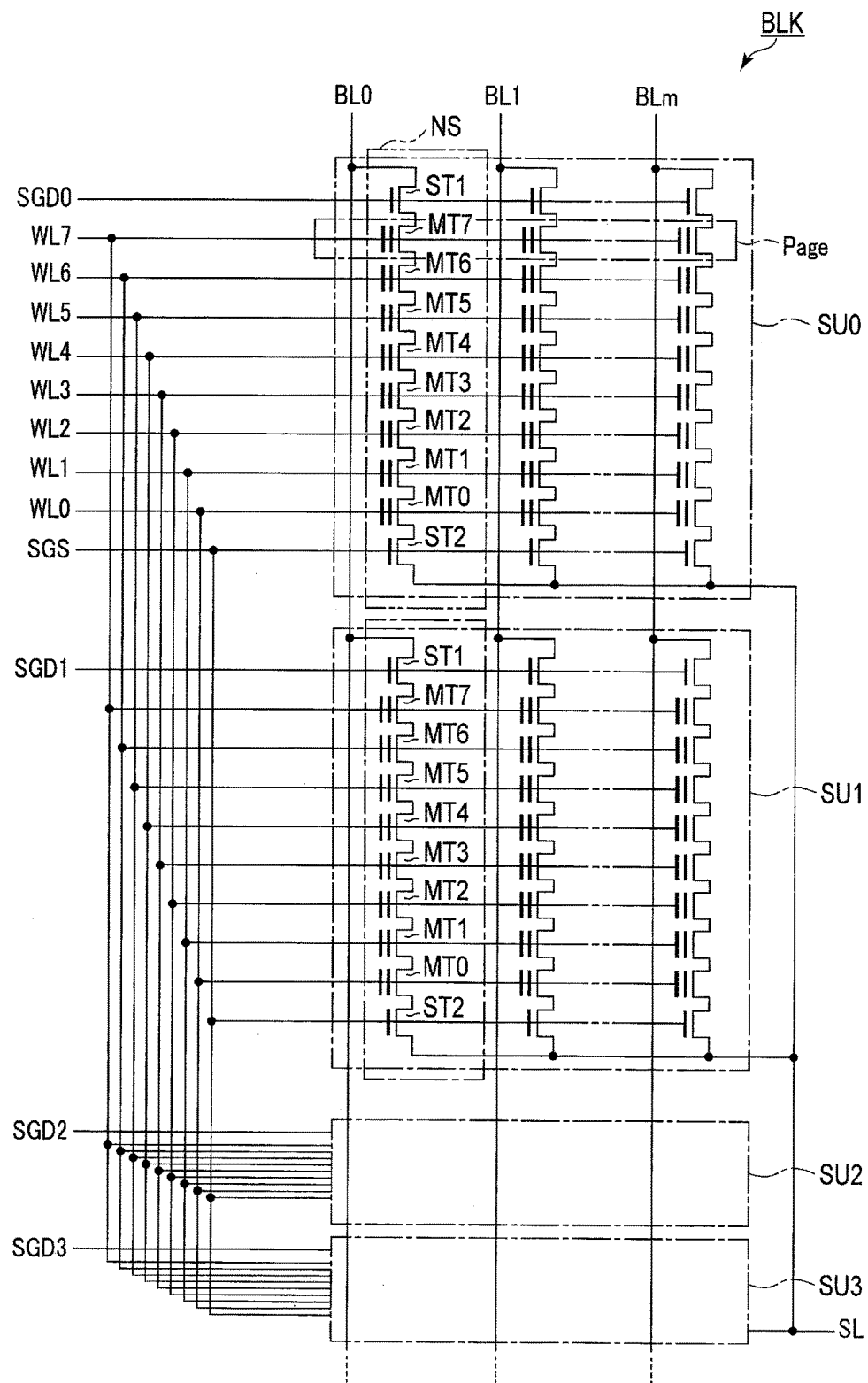
FIG. 2 is a diagram showing an example of a circuit configuration of a memory cell array according to the first embodiment.

In general, according to one embodiment, a semiconductor memory includes a plurality of memory cells, a word line, a plurality of bit lines, and a controller. Each of the plurality of memory cells stores data of multiple bits based on a threshold voltage. If first data is stored as multiple-bit data, the plurality of memory cells are set so as to have a first threshold voltage, if second data is stored as multiple-bit data, the memory cells are set so as to have a second threshold voltage higher than the first threshold voltage, and if third data is stored as multiple-bit data, the memory cells are set so as to have a third threshold voltage higher than the second threshold voltage. The word line is coupled to the plurality of memory cells. The plurality of bit lines are respectively coupled to the plurality of memory cells. The controller executes a first write, and classifies a plurality of memory cells to which the second data should be written into a plurality of subgroups in accordance with a result of the first write, and after the classification, the controller executes a second write that includes a first program loop. When the second write is executed, the controller associates a plurality of memory cells to which the first data should be written with a first group of memory cells; a plurality of memory cells to which the third data should be written with a second group of memory cells; the memory cells classified into one of the plurality of subgroups among the plurality of memory cells to which the second data should be written with the first group of memory cells; and the memory cells classified into another subgroup among the plurality of memory cells to which the second data should be written with the second group of the memory cells. The controller applies two program pulses (a first program pulse and a second program pulse) to the word line in a single program loop (a first program loop); a first voltage to bit lines coupled to the memory cells of the first group, while the first program pulse is being applied; a second voltage which is higher than the first voltage to the bit lines coupled to the memory cells of the first group and the first voltage to bit lines coupled to the memory cells of the second group while the second program pulse is being applied.

Hereinafter, the embodiments will be described with reference to the accompanying drawings. The drawings are schematic. In the explanation below, constituent elements having the same functions and configurations will be denoted by the same reference symbols. The numbers after the letters constituting the reference symbols are used to distinguish elements which are denoted by the reference symbols including the same letters and which have similar configurations. If there is no need of mutually distinguishing the elements which are denoted by the reference symbols that include the same letters, the same elements are denoted by the reference symbols that include only the same letters.

[1] First Embodiment

A semiconductor memory according to the first embodiment will be described.

[1-1] Configuration

[1-1-1] Configuration of Semiconductor Memory 10

FIG. 1 shows a configuration example of a memory system 1 that includes a semiconductor memory 10 according to the first embodiment. The memory system 1 includes a semiconductor memory 10 and a memory controller 20 as shown in FIG. 1.

The semiconductor memory 10 is a NAND-type flash memory that is capable of storing data in a non-volatile manner. As shown in FIG. 1, the semiconductor memory 10 includes a memory cell array 11, a command register 12, an address register 13, a sequencer 14, a driver 15, a row decoder 16, and a sense amplifier module 17.

The memory cell array 11 includes a plurality of blocks BLK0 through BLKn (n is an integer greater than or equal to 1). A block BLK is a set of non-volatile memory cells, and is, for example, a unit of data erasure. In the memory cell array 11, a plurality of bit lines and a plurality of word lines are provided, and each memory cell is associated with one bit line and one word line. The memory cell array 11 will be described later in detail.

The command register 12 retains a command CMD that is received by the semiconductor memory 10 from the memory controller 20. The command CMD includes commands to cause the sequencer 14 to execute a read operation and a write operation, for example.

The address register 13 retains address information ADD that the semiconductor memory 10 receives from the memory controller 20. The address information ADD includes, for example, a block address BA and a page address PA. The block address BA is used to select a block BLK that includes a memory cell that is a target for various types of operations. The page address PA is used to select a word line that is associated with a memory cell that is a target for various types of operations.

The sequencer 14 controls the operation of the entire semiconductor memory 10 based on the command CMD retained in the command register 12. For example, the sequencer 14 controls the driver 15, the row decoder 16, and the sense amplifier module 17 to perform a write operation for data DAT received from the memory controller 20.

The driver 15 generates a desired voltage based on the control of the sequencer 14. Subsequently, the driver 15 respectively applies, to corresponding signal lines, a voltage to be applied to a word line that is selected based on a page address PA retained in the address register 13, and a voltage to be applied to word lines that are not selected. Hereinafter, a word line that is selected will be referred to as a selected word line, and a word line that is not selected will be referred to as a non-selected word line.

The row decoder 16 selects one block BLK based on a block address BA retained in the address register 13. The row decoder 16 then applies the voltage that is applied to each signal line by the driver 15 to each of a selected word line and non-selected word lines, for example.

The sense amplifier module 17 applies a desired voltage to each bit line in accordance with write data DAT received from the memory controller 20. The sense amplifier module 17 determines data stored in a memory cell based on the voltage of the bit line, and transmits the determined read data DAT to the memory controller 20. The configuration of the sense amplifier module 17 will be described later in detail.

[1-1-2] Configuration of Memory Controller 20

The memory controller 20 instructs the semiconductor memory 10 to execute read, write, erase operations, etc. in response to a command from a host device 30. The memory controller 20 includes a processor 21, a random access memory (RAM) 22, a host interface circuit 23, a buffer memory 24, an error correction code (ECC) circuit 25, and a NAND interface circuit 26, as shown in FIG. 1.

The processor 21 controls the overall operation of the memory controller 20. For example, the processor 21 issues a write command in response to a write command received from the host device 30. The processor 21 executes various types of processing to manage a memory space of the semiconductor memory 10, such as ware leveling, etc.

The RAM 22 is a volatile memory, such as a dynamic random access memory (DRAM), for example. The RAM 22 is used as a working area of the processor 21. The RAM 22, for example, retains a firmware for managing the semiconductor memory 10, various types of management tables, and count results at the time of various types of operations, and so on.

The host interface circuit 23 is coupled to an external host device 30 via a host bus, and controls transfer of data, commands, and addresses between the memory controller 20 and the host device 30. The host interface circuit 23 supports communication interface standards, for example, SATA (Serial Advanced Technology Attachment), SAS (Serial Attached SCSI), PCIe (PCI Express) (registered trademark), and so on.

The buffer memory 24 temporarily retains read data received by the memory controller 20 from the semiconductor memory 10, and write data received from the host device 30.

The ECC circuit 25 executes error correction processing on data. Specifically, at the time of a write operation, the ECC circuit 25 generates parity based on the write data received from the host device 30, and adds the generated parity to the write data. At the time of a read operation, the ECC circuit 25 generates a syndrome based on the read data received from the semiconductor memory 10, and detects and corrects errors in the read data based on the generated syndrome.

The NAND interface circuit 26 controls transfer of data, commands, addresses between the memory controller 20 and the semiconductor memory 10, and supports the NAND interface standards. For example, the NAND interface circuit 26 transmits a command latch enable signal CLE, an address latch enable signal ALE, a write enable signal WEn, and a read enable signal REn, receives an ready busy signal RBn, and transmits and receives an input/output signal I/O. The signal CLE is a signal notifying the semiconductor memory 10 that the received signal I/O is a command CMD. The signal ALE is a signal notifying the semiconductor memory 10 that the received signal I/O is address information ADD. The signal WEn is a signal instructing the semiconductor memory 10 to input the signal I/O. The signal REn is a signal instructing the semiconductor memory 10 to output the signal I/O. The signal RBn is a signal for notifying the memory controller 20 of whether the semiconductor memory 10 is in a ready state in which a command from the controller 20 can be received or in a busy state in which a command from the controller 20 cannot be received. The signal I/O is, for example, an 8-bit signal, and may include a command CMD, address information ADD, write data DAT, and read data.

The semiconductor memory 10 and the memory controller 20 as explained in the above may constitute one semiconductor apparatus by a combination thereof. Such a semiconductor apparatus may be a memory card, such as an SD™ card, and an SSD (solid state drive), for example.

[1-1-3] Configuration of Memory Cell Array 11

FIG. 2 shows an example of a circuit configuration of the memory cell array 11 according to the first embodiment. A circuit configuration of the memory cell array 11 according to the first embodiment will be explained below, focusing on one block BLK.

A block BLK includes, for example, four string units, SU0 through SU3, as shown in FIG. 2. Each string unit SU includes a plurality of NAND strings NS that are respectively associated with the bit lines BL0 through BLm (m is an integer greater than or equal to 1). A NAND string NS includes, for example, eight memory cell transistors MT0 through MT7 and selection transistors ST1 and ST2.

Each memory cell transistor MT is provided with a control gate and a charge storage layer, and stores data in a nonvolatile manner. The memory cell transistors MT0 to MT7 included in each NAND string NS are coupled in series between the source of the selection transistor ST1 and the drain of the selection transistor ST2. The control gates of the memory cell transistors MT0 to MT7 in the same block BLK are respectively coupled in common to the word lines WL0 through WL7. A set of 1-bit data that is stored in the plurality of memory cell transistors MT coupled in common to a word line WL in each string unit SU is called a "page".

The selection transistors ST1 and ST2 are used to select a string unit SU at the time of various types of processing. The gates of the selection transistors ST1 respectively included in the string units SU0 through SU3 in the same block BLK are respectively coupled in common to the selection gate lines SGD0 through SGD3. The drains of the selection transistors ST1 in the same column in each block BLK are coupled in common to the corresponding bit line BL. The gates of the selection transistors ST2 in the same block BLK are coupled in common to a selection gate line SGS. The sources of the selection transistors ST2 in the same block BLK are coupled in common to a source line SL between multiple blocks BLK.

The above-described memory cell transistors MT are capable of storing data of 2 or more bits by classifying threshold voltages into more than two levels. For example, the memory cell transistors MT store 3-bit data if a triple-level (TLC) scheme is adopted as a write scheme, and store 4-bit data if a quadruple-level (QLC) scheme is adopted. In other words, a plurality of memory cell transistors MT coupled in common to a word line WL store 3 pages of data if the TLC scheme is adopted, and store 4 pages of data if the QLC scheme is adopted.

FIG. 3 shows examples of threshold distributions of the memory cell transistors MT when the TLC scheme (3 bits/cell) and the QLC scheme (4 bits/cell) are adopted, and the vertical axis represents the number of the memory cell transistors MT, and the horizontal axis represents a threshold voltage Vth of a memory cell transistor MT. The threshold voltages of the memory cell transistors MT are classified into eight threshold distributions if the TLC scheme is adopted, and sixteen threshold distributions if the QLC scheme is adopted, as shown in FIG. 3.

The eight threshold distributions in the TLC scheme are respectively referred to as "ER" level, "A" level, "B" level, "C" level, "D" level, "E" level, "F" level, and "G" level, from lower to higher threshold voltages. Three-bit data is allocated to each of these threshold distributions. The sixteen threshold distributions in the QLC scheme are respectively referred to as "ER" level, "A" level "B" level, "C" level, "D" level, "E" level, "F" level, "G" level "H" level, "I" level, "J" level, "K" level, "L" level, "M" level, "N" level, and "O" level, from lower to higher threshold voltages. Four-bit data is allocated to each of these threshold distributions.

In the threshold distributions in each of the above-described write schemes, a read voltage is set between neighboring threshold distributions. For example, a read voltage AR is set between a maximum threshold voltage in the "ER" level and a minimum threshold voltage in the "A" level, and is used for an operation of determining whether a threshold voltage in a memory cell transistor MT is included in the threshold distribution of the "ER" level or in the threshold distribution higher than or equal to "A" level. A read voltage BR is set between a maximum threshold voltage in the "A" level and a minimum threshold voltage in the "B" level, and is used for an operation of determining whether a threshold voltage of a memory cell transistor MT is included in the threshold distribution lower than or equal to "A"-level or in the threshold distribution higher than or equal to "B"-level.

For example, when a read voltage AR is applied to the word line WL, the memory cell transistors MT included in the "ER" level are turned to an ON state, and the memory cell transistors MT included in the threshold distributions higher than or equal to the "A" level are turned to an OFF state. When a read voltage BR is applied to a word line WL, the memory cell transistors MT included in the threshold distributions lower than or equal to the "A" level are turned to an ON state, and the memory cell transistor MT included in the threshold distributions higher than or equal to the "B" level are turned to an OFF state.

Other read voltages CR, DR, ER, FR, GR, HR, IR, JR, KR, LR, MR, NR, and OR are also respectively set between neighboring threshold distributions, similar to the read voltages AR and BR.

In each write scheme, a read pass voltage Vread is set to a voltage higher than a maximum threshold voltage in the highest threshold distribution. When a read pass voltage Vread is applied to a word line WL, the memory cell transistors MT are turned to an ON state, despite data stored therein.

FIG. 4 shows an example of data allocation for the threshold distributions of the memory cell transistors MT in a case where the TLC scheme is adopted. The voltages AV, BV, CV, DV, EV, FV, and GV shown in FIG. 4 are verify voltages used for programming in "A" level, "B" level, "C" level, "D" level, "E" level, "F" level, and "G" level. The semiconductor memory 10 detects whether a threshold voltage of a memory cell transistor MT exceeds a desired verify voltage in order to determine whether the memory cell transistor passes verification, and the programming of the memory cell transistor MT is thereby completed. For example, a verify voltage AV is set between a maximum threshold voltage in the "ER" level and a minimum threshold voltage in the "A" level, and is located in the vicinity of the lower tail of the "A"-level threshold distribution. The same applies to the other verify voltages BV, CV, DV, EV, FV, and GV. In other words, the verify voltages AV, BV, CV, DV, EV, FV, and GV are set to voltages higher than the read voltages AR, BR, CR, DR, ER, FR, and GR, for example.

The data allocation in the TLC scheme shown in FIG. 4 is listed below:
"ER" level: "111" ("Lower bit/Middle bit/Upper bit)
"A" level: "110" data
"B" level: "100" data
"C" level: "101" data
"D" level: "001" data
"E" level: "011" data
"F" level: "010" data
"G" level: "000" data If this data allocation is applied, 1-page data in the lower bit (lower page data) in a read operation is determined based on a result of the read operation executed using the read voltage DR. One-page data in the middle bit (middle page data) is determined based on a result of the read operation executed using the read voltages BR, ER, and GR. One-page data in the upper bit (upper page data) is determined based on a result of the read operation executed using the read voltages AR, CR, and FR.

This data allocation is called "1-3-3 code" because the Lower page data, the Middle page data, and the Upper page data are determined by executing a read operation for one time, three times, and three times, respectively. In the following, an example in which the TLC scheme is adopted as a write scheme, and the 1-3-3 code as shown in FIG. 4 is adopted for data allocation, will be explained.

[1-1-4] Configuration of Sense Amplifier Module 17

Figure 5:
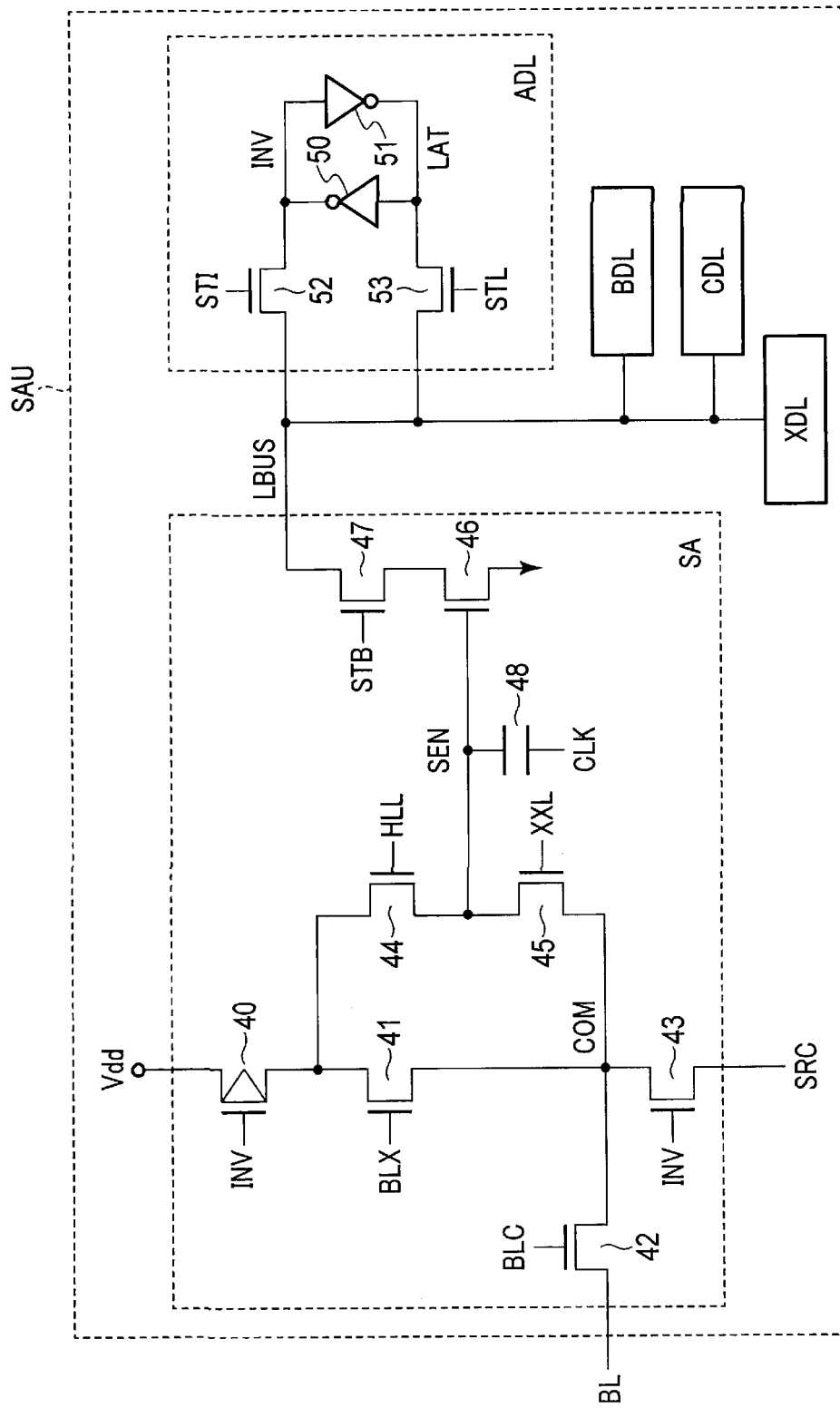
FIG. 5 is a diagram showing an example of a circuit configuration of a sense amplifying unit according to the first embodiment.

FIG. 5 shows an example of a circuit configuration of a sense amplifier module 17 according to the first embodiment. The sense amplifier module 17 includes a plurality of sense amplifying units SAU respectively associated with the bit lines BL0 to BLm, and FIG. 5 shows a circuit configuration of one of the sense amplifying units SAU in detail.

As shown in FIG. 5, the sense amplifying unit SAU includes an sense amplifier SA, and latch circuits ADL, BDL, CDL, and XDL. The sense amplifier SA and the latch circuits ADL, BDL, CDL, and XDL are coupled to each other via a bus LBUS so that data can be transmitted and received therebetween.

In a read operation, for example, the sense amplifier SA senses data that is read and output to a corresponding bit line BL, and determines whether the read data is "0" or "1". The sense amplifier SA includes a p-channel MOS transistor 40, n-channel MOS transistors 41-47, and a capacitor 48, for example.

One end of the transistor 40 is coupled to a power supply line, and a gate of the transistor 40 is coupled to the node INV. One end of the transistor 41 is coupled to the other end of the transistor 40, the other end of the transistor 41 is coupled to the node COM, and a control signal BLX is input to the gate of the transistor 41. One end of the transistor 42 is coupled to the node COM, the other end of the transistor 42 is coupled to a corresponding bit line BL, and a control signal BLC is input to the gate of the transistor 42. One end of the transistor 43 is coupled to a node COM, the other end of the transistor 43 is coupled to the node SRC, and the gate of the transistor 43 is coupled to the node INV. One end of the transistor 44 is coupled to the other end of the transistor 40, the other end of the transistor 44 is coupled to the node SEN, and a control signal HLL is input to the gate of the transistor 44. One end of the transistor 45 is coupled to the other end of the node SEN, the other end of the transistor 45 is coupled to the node COM, and a control signal XXL is input to the gate of the transistor 45. One end of the transistor 46 is grounded, and the gate of the transistor 46 is coupled to the node SEN. One end of the transistor 47 is coupled to the other end of the transistor 46, the other end of the transistor 47 is coupled to the bus LBUS, and a control signal STB is input to the gate of the transistor 47. One end of the capacitor 48 is coupled to the node SEN, and a clock CLK is input to the other end of the capacitor 48.

The control signals BLX, HLL, XXL, and STB explained above are generated by, for example, the sequencer 14. For example, a voltage Vdd, which is a power supply voltage of the semiconductor memory device 10, is applied to the power supply line which is coupled to one end of the transistor 40, and for example, a voltage Vss, which is a ground voltage of the semiconductor memory device 10, is applied to the node SRC.

The latch circuits ADL, BDL, CDL, and XDL can temporarily store read data. The latch circuit XDL is coupled to a not-shown input/output circuit, and is used to input and output data between the sense amplifying unit SAU and the input/output circuit. The latch circuit ADL includes, for example, inverters 50 and 51, and n-channel MOS transistors 52 and 53.

The input node of the inverter 50 is coupled to the node LAT, and the output node of the inverter 50 is coupled to the node INV. The input node of the inverter 51 is coupled to the node INV, and the output node of the inverter 51 is coupled to the node LAT. One end of the transistor 52 is coupled to the node INV, the other end of the transistor 52 is coupled to the bus LBUS, and a control signal STI is input to the gate of the transistor 52. One end of the transistor 53 is coupled to the node LAT, the other end of the transistor 53 is coupled to the bus LBUS, and a control signal STL is input to the gate of the transistor 53. Since the circuit configurations of the latch circuits BDL, CDL, and XDL are similar to, for example, the circuit configuration of the latch circuit ADL, an explanation thereof will be omitted.

In the above-described sense amplifier module 17, a timing for determining data that is read and output to a bit line BL by each sense amplifying unit SAU is based on the timing when a control signal STB is asserted.

The sense amplifier module 17 in the first embodiment is not limited to the above-described configuration, and may be changed in various ways. For example, the number of latch circuits provided in each sense amplifying unit SAU may be changed as needed based on an adopted write scheme.

[1-2] Operation

In the memory system 1 according to the first embodiment, the memory controller 20 instructs the semiconductor memory 10 to execute a two-stage write operation to write data received from the host device 30. In the following, the first stage of a write operation executed by the semiconductor memory 10 will be referred to as a first write operation, and the second stage will be referred to as a second write operation.

The sequencer 14 of the semiconductor memory 10 iteratively executes a program loop in the first write operation and the second write operation. The program loop includes a program operation and a verification operation. A program voltage used in a program operation steps up in each program loop. Program levels for verification operations to be executed at can change every program loop. The number of program levels for verification operations can also change. These are chosen appropriately as needed in accordance with progress of a write operation. In each program loop, channel boost, for example, is applied to program-disabled memory cell transistors MT, and an increase of threshold voltages of the memory cell transistors MT is thereby suppressed.

In the semiconductor memory 10 according to the first embodiment, a single-pulse scheme is adopted for a program operation in a first write operation, and a double-pulse scheme is adopted for a program operation of a second write operation. In a program operation in a single-pulse scheme, one program pulse is applied to a selected word line every program loop. In contrast, in a program operation in a double-pulse scheme, two program pulses are sequentially applied to a selected word line every program loop. Furthermore, in a program operation in a double-pulse scheme, it is possible to write different data between the first program pulse and the second program pulse. If a memory cell transistor MT is a target of one of the program pulses in the double pulse scheme, the memory cell may be program-disabled when the other program pulse is being applied in the same program loop.

(First Write Operation)

Figure 6:
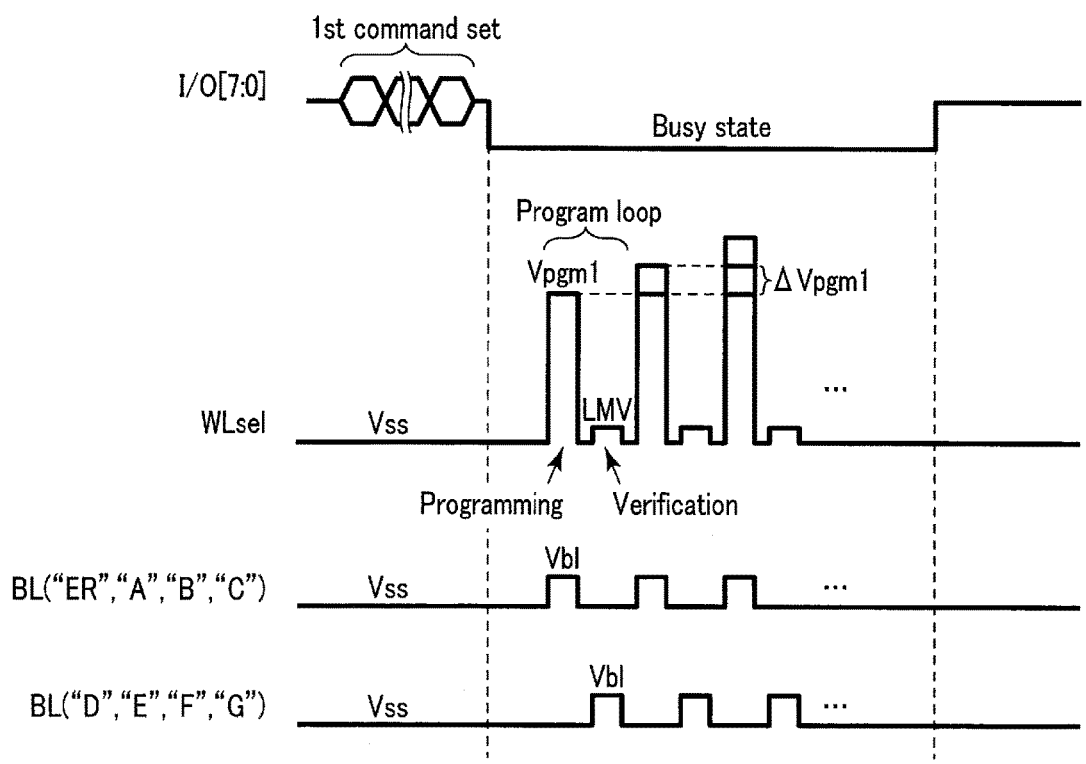
FIG. 6 is a diagram showing an example of voltages to be applied to different lines in the semiconductor memory in a first write operation according to the first embodiment.

FIG. 6 shows an example of a state of the input/output signal I/O, a voltage of a selected word line WLsel, and voltages of bit lines BL for each program level in a first write operation in the semiconductor memory 10 according to the first embodiment. The input/output signal I/O indicates commands received from a memory controller 20 by the semiconductor memory 10, and a period when the semiconductor memory 10 is in a busy state. In the following description, it is assumed that a ready busy signal RBn is at "H" level or "L" level when the semiconductor memory 10 is in a ready state or in a busy state, respectively. In an initial state before a first write operation is executed, a ground voltage Vss, for example, is applied to the word lines WL and the bit lines BL.

As shown in FIG. 6, the memory controller 20 transmits a first command set to the semiconductor memory 10. The first command set includes a command for instructing the semiconductor memory 10 to execute a first write operation, and Lower page data.

This Lower page data is retained in a latch circuit provided within the sense amplifier module 17. The semiconductor memory 10 is then turned to a busy state, and executes a first write operation in which the single-pulse scheme is adopted, using the Lower page data retained in the sense amplifier module 17.

For example, the sequencer 14 sets memory cell transistors MT to be programmed to the "ER" level to program-disabled, and sets memory cell transistors MT which are to be programmed to the "LM" level to program-enabled. Hereinafter, a bit line BL that corresponds to a program-enabled memory cell transistor MT will be referred to as a program-enabled bit line BL, and a bit line BL that corresponds to a program-disabled memory cell transistor MT will be referred to as a program-disabled bit line BL.

The sequencer 14 then executes a first write operation on memory cell transistors MT to which "LM" data is programmed, using a verify voltage LMV. A verify voltage LMV is set lower than a verify voltage CV, for example, and in such a manner that the threshold voltages of the memory cell transistors MT that have passed verification do not significantly exceed a verify voltage DV.

When the first write operation begins, the sequencer 14 first executes a program operation. In a program operation executed for the first time, the sense amplifier module 17 applies a voltage Vbl to a program-disabled bit line BL, and a ground voltage Vss to a program-enabled bit line BL. The voltage Vbl is higher than a ground voltage Vss, and lower than a power supply voltage Vdd, for example. When the voltage Vbl is applied to a program-disabled bit line BL, a selection transistor ST1 of a corresponding NAND string NS, for example, is turned to an OFF state, and a channel of the NAND string NS is turned to a floating state.

The row decoder 16 applies a program voltage Vpgm1 to the selected word line WLsel. The program voltage Vpgm1 is high enough to increase threshold voltages of memory cell transistors MT. When the program voltage Vpgm1 is applied to the selected word line WLsel, the channel in a floating state is boosted, thereby suppressing an increase of the threshold voltages in the program-disabled memory cell transistors MT. In each of the program-enabled memory cell transistors MT, electrons are injected into a charge storage layer between the control gate and the channel, and the threshold voltage is increased.

Next, the sequencer 14 executes a verification operation. In a verification operation, the sense amplifier module 17 applies a voltage Vss to a program-disabled bit line BL, and a voltage Vbl to a program-enabled bit line BL, for example. The driver 15 and the row decoder 16 apply a verify voltage LMV to the selected word line WLsel. Subsequently, each sense amplifying unit SAU determines whether the threshold voltages of the corresponding memory cell transistors MT exceed the verify voltage LMV or not, and the sequencer 14 sets the bit line BL that has passed verification to program-disabled in program operations executed thereafter.

A set of a single-pulse program operation and a verification operation explained above constitutes one program loop. The sequencer 14 iteratively executes the program loop, and steps up a program voltage Vpgm1 by ΔVpgm1 every program loop. If the sequencer 14 then detects an excess in the number of memory cell transistors MT that have, for example, passed verification over a predetermined number, the sequencer 14 finishes a first write operation and changes the state of the semiconductor memory 10 to a ready state.

An example of iteratively executing a program loop that includes a verification operation is explained above; however, a first write operation is not limited thereto. For example, a verification operation is not necessarily executed in a first write operation. In this case, the sequencer 14 controls each module in such a manner that a program pulse (a program voltage) is applied to a selected word line WLsel for the predetermined number of times, while respective predetermined voltages are applied to a program-disabled bit line BL and a program-enabled bit line BL. If a program pulse is applied for two or more times, the sequencer 14 steps up its program voltage every time a program pulse is applied.

Figure 7:
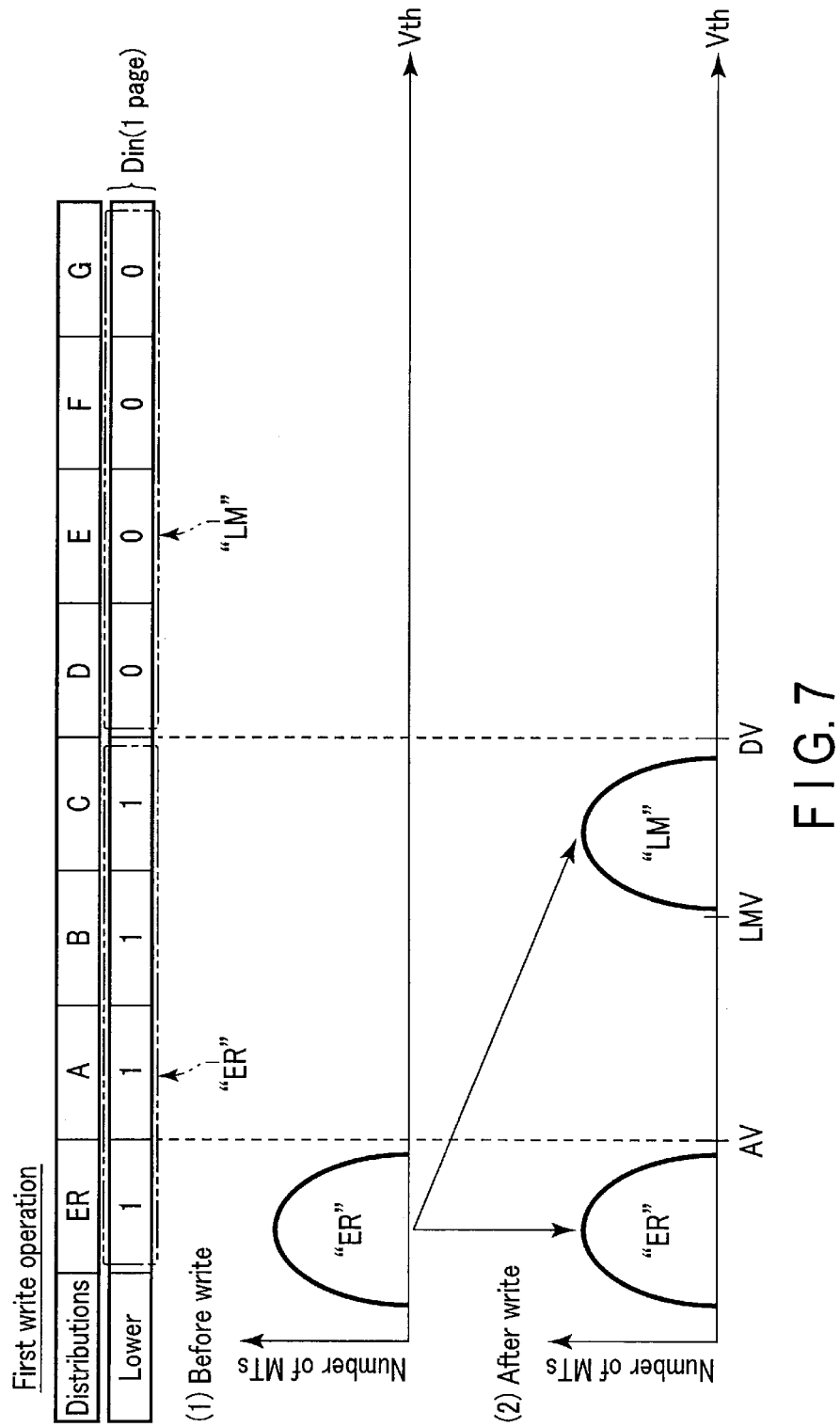
FIG. 7 is a diagram showing an example of evolution of threshold distributions of memory cell transistors in a first write operation of the semiconductor memory according to the first embodiment.

FIG. 7 shows an example of evolution of the threshold distributions of the memory cell transistors MT in a first write operation of the semiconductor memory 10 according to the first embodiment. The top portion of FIG. 7 shows data of one page used in a first write operation, and (1) and (2) of FIG. 7 show the threshold distributions of the memory transistors MT before and after a first write operation is executed in the semiconductor memory 10.

As shown in the top portion of FIG. 7, the Lower page data used in a first write operation is input from the memory controller 20.

As shown in (1) of FIG. 7, before a first write operation is executed, the threshold voltages of the memory cell transistors MT are distributed in the "ER" level.

As shown in (2) of FIG. 7, after a first write operation is executed, the threshold voltages are distributed in the "ER" level, because an increase of the threshold voltages is suppressed in the memory cell transistors MT in which "1 (Lower bit)" data is programmed. The threshold voltages of the memory cell transistors MT in which "0" data is programmed are increased, and the threshold distributions at the "LM" levels are thus formed from the "ER" level.

As described above, in a first write operation, two groups of threshold distributions are formed from the threshold distributions at the "ER" level.

(Second Write Operation)

Figure 8:
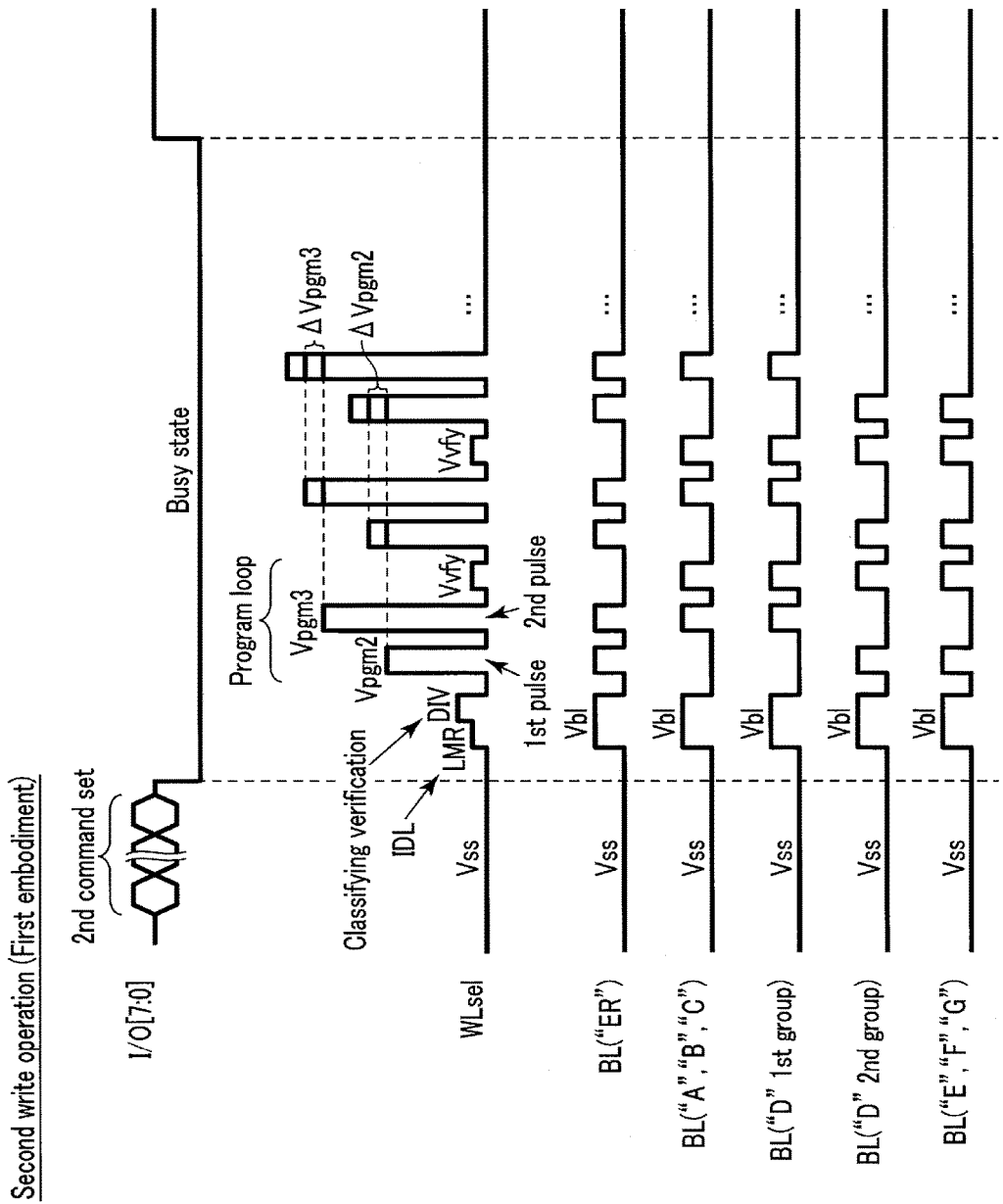
FIG. 8 is a diagram showing an example of voltages to be applied to different lines in the semiconductor memory in a second write operation according to the first embodiment.

FIG. 8 shows an example of a state of the input/output signal I/O, a voltage of a selected word line WLsel, and voltages of bit lines BL for each levels in a second write operation in the semiconductor memory 10 according to the first embodiment. The input/output signal I/O indicates commands received from a memory controller 20 by the semiconductor memory 10, and a period when the semiconductor memory 10 is in a busy state. In an initial state before a second write operation is executed, a ground voltage Vss, for example, is applied to a word line WL and a bit line BL.

As shown in FIG. 8, the memory controller 20 first transmits a second command set to the semiconductor memory 10. The second command set includes a command for instructing the semiconductor memory 10 to execute a second write operation, that is, middle page data and upper page data.

The middle page data and upper page data are retained in a latch circuit provided within the sense amplifier module 17. The semiconductor memory 10 is then turned to a busy state, and executes a second write operation, using the middle and upper page data retained in the sense amplifier module 17. Semiconductor memory 10 may possibly turn to a busy state while it is still receiving the second command set.

When the second write operation begins, the sequencer 14 first executes IDL (internal data load). IDL is an operation of reading data stored in a memory cell transistor MT corresponding to a selected word line WL prior to application of a program pulse to the selected word line.

In IDL, the sense amplifier module 17 applies a voltage Vbl to each bit line BL. The row decoder 16 then applies a read voltage LMR to the selected word line WLsel. A read voltage LMR is set between a maximum threshold voltage in the "ER" level and a minimum threshold voltage in the "LM" level. Subsequently, each sense amplifying unit SAU determines whether the threshold voltages of the corresponding memory cell transistors MT exceed the read voltage LMR, and the lower page data written by a first write operation is restored in a latch circuit in the sense amplifier module 17.

Subsequently, the sequencer 14 executes a classifying verification operation. A classifying verification operation is an operation to classify a plurality of memory cell transistors MT that are targeted for "D"-level programming into a plurality of groups in accordance with a result of a first write operation. Specifically, in a classifying verification operation, the sequencer 14 classifies a plurality of memory cell transistors MT targeted for "D"-level programming into a first group with higher threshold voltages and a second group with lower threshold voltages, for example. In a classifying verification operation, the sense amplifier module 17 applies a voltage Vbl to each bit line BL. The driver 15 and the row decoder 16 then apply a verify voltage DIV to the selected word line WLsel. The verify voltage DIV is included in the threshold distributions at the "LM" level, or preferably may be set to a voltage corresponding to the middle of the threshold distributions at the "LM" level. In other words, the verify voltage DIV is set higher than the read voltage LMR and lower than the read voltage DR. Subsequently, each sense amplifying unit SAU determines whether or not the threshold voltages of the memory cell transistors MT that are targeted for "D"-level programming exceed the verify voltage DIV, and the sequencer 14 classifies the memory cell transistors MT that are targeted for "D"-level programming into the first group and the second group in accordance with a result of the verification. Specifically, the sequencer 14 classifies the memory cell transistors MT that are targeted for "D"-level programming into the first group if they pass verification using the verify voltage DIV, and into the second group if they fail verification using the verify voltage DIV.

The sequencer 14 then executes a double-pulse program operation based on the middle page data and upper page data stored in the sense amplifier module 17 and the lower page data read from the memory cell transistors MT.

Specifically, the sequencer 14 disables programming on the memory cell transistors MT of the "ER" level, the "E" level, the "F" level, the "G" level, and the second group of the "D" level. On the other hand, the sequencer 14 enables programming on the memory cell transistors MT of the "A" level, the "B" level, the "C" level, and the first group of the "D" level.

The sense amplifier module 17 then applies a voltage Vbl to a program-disabled bit line BL, and a ground voltage Vss to a program-enabled bit line BL. The driver 15 and the row decoder 16 then apply a first pulse to the selected word line WLsel. A program voltage Vpgm2 is the initial voltage of the first pulse in a program loop executed for the first time. Vpgm2 is set lower than a program voltage Vpgm1, for example. When a first pulse is applied to the selected word line WLsel, the threshold voltages of the program-disabled memory cell transistors MT is suppressed from increasing by channel boosting, for example, and the threshold voltages of the program-enabled memory cell transistors MT are increased by a potential difference between a control gate and a channel.

Next, the sequencer 14 disables programming on memory cell transistors MT of the "ER" level, the "A" level, the "B" level, the "C" level, and the first group of the "D" level. On the other hand, the sequencer 14 enables programming on memory cell transistors MT of the "E" level, the "F" level, the "G" level, and the second group of the "D" level.

The sense amplifier module 17 then applies a voltage Vbl to a program-disabled bit line BL, and a ground voltage Vss to a program-enabled bit line BL. The driver 15 and the row decoder 16 then apply a second pulse to the selected word line WLsel. A program voltage Vpgm3 is the initial voltage of the second pulse in a program loop executed for the first time. Vpgm3 is set higher than a program voltage Vpgm2. When a second pulse is applied to the selected word line WLsel, the threshold voltages of the program-disabled memory cell transistors MT are suppressed from increasing by channel boosting, for example. On the other hand, the threshold voltages of program-enabled memory cell transistors MT are increased by a potential difference between a control gate and a channel.

Next, the sequencer 14 executes a verification operation. In a verification operation, the sense amplifier module 17 applies a voltage Vss to a program-disabled bit line BL, and a voltage Vbl to a program-enabled bit line BL, for example. The driver 15 and the row decoder 16 then apply a verify voltage Vvfy to the selected word line WLsel. The verify voltage Vvfy corresponds to one of the verify voltages AV, BV, CV, DV, EV, FV, and GV, and is chosen from a lower to higher voltage in accordance with progress of the program loop. One or more verify voltages Vvfy may be consecutively applied in accordance with progress of the program loop. Each sense amplifying unit SAU determines whether or not the threshold voltages of the corresponding memory cell transistors MT exceed the verify voltage Vvfy, and the sequencer 14 sets the bit line BL that has passed verification to program-disabled in program operations executed thereafter.

A set of a double-pulse program operation using a first pulse and a second pulse and a verification operation as explained above constitute one program loop. Hereafter, the sequencer 14 iteratively executes the program loops, and steps up a program voltage Vpgm2 by ΔVpgm2 and a program voltage Vpgm3 by ΔVpgm3 in each program loop. The values ΔVpgm2 and ΔVpgm3 are smaller than ΔVpgm1, for example.

If the sequencer 14 then detects an excess in the number of memory cell transistors MT that have passed verification over a predetermined number in each level, for example, the sequencer 14 finishes a second write operation and changes the state of the semiconductor memory 10 to a ready state.

As explained above, the number of program pulses applied to a selected word line WLsel within a program loop in a second write operation is greater than a first write operation.

Figure 9:
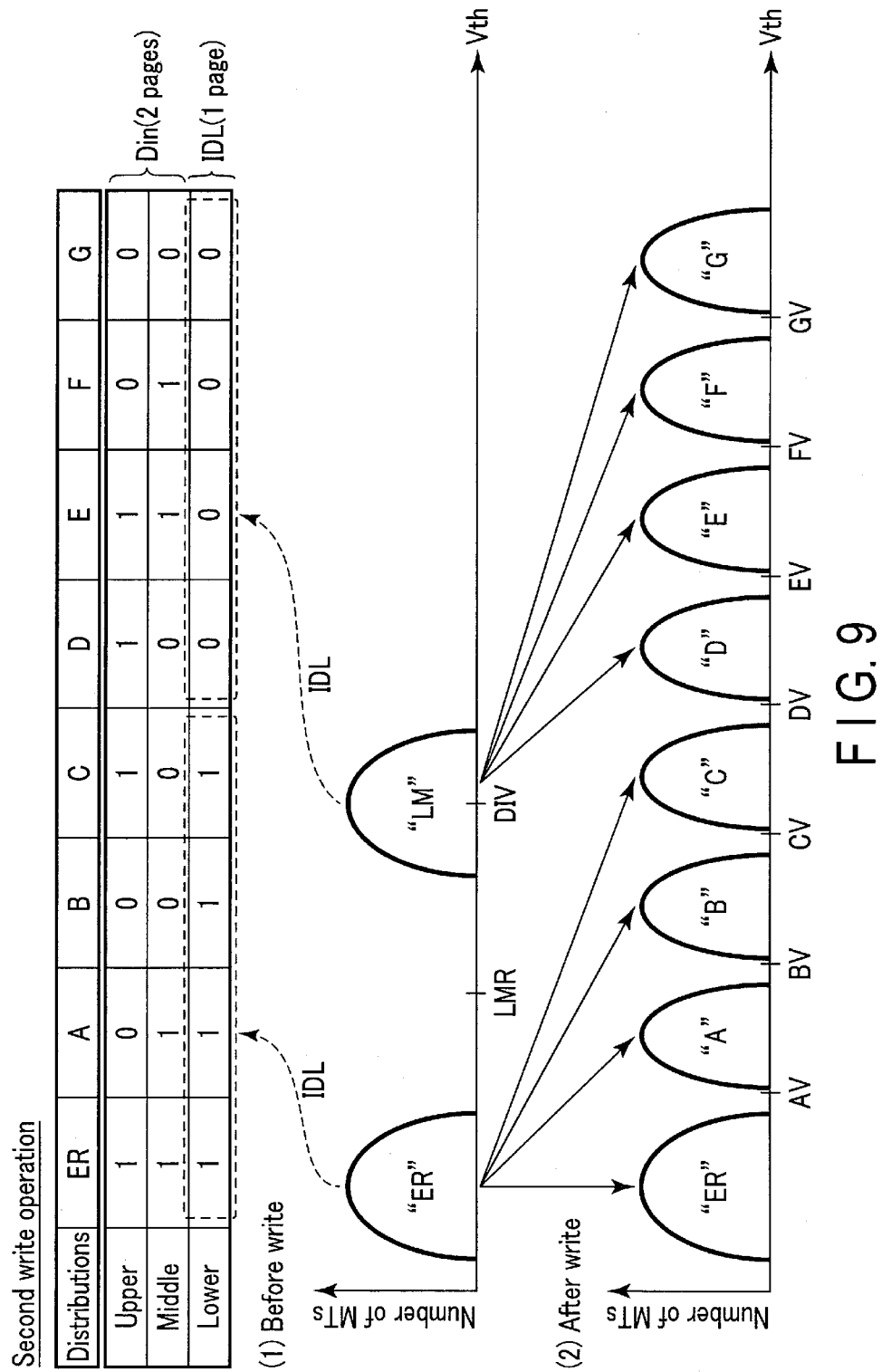
FIG. 9 is a diagram showing an example of evolution of threshold distributions of memory cell transistors in a second write operation of the semiconductor memory according to the first embodiment.

FIG. 9 shows an example of evolution of the threshold distributions of the memory cell transistors MT in a second write operation of the semiconductor memory 10 according to the first embodiment. The top portion of FIG. 9 shows three pages of data used in a second write operation, and (1) and (2) of FIG. 9 show the threshold distributions of the memory transistors MT before and after a second write operation is executed in the semiconductor memory 10.

As shown in the top portion of FIG. 9, the lower page data used in a second write operation is restored by IDL, and the middle page data and the upper page data are input from the memory controller 20.

As shown in FIG. 9 (1), the threshold voltages of the memory cell transistors MT are distributed in the "ER" level and the "LM" level before a second write operation is executed.

As shown in FIG. 9 (2), after a second write operation is executed, eight threshold distributions ("ER", "A", "B", "C", "D", "E", "F", and "G" levels) are formed. The "ER" level corresponds to "111" ("lower/middle/upper" bits) data. The threshold voltages of the memory cell transistors MT are held to the "ER" level by suppressing increase of threshold voltages, if "111" data is written to the memory cells. The "A", "B", "C", "D", "E", "F", and "G" levels correspond to "011", "001", "101", "100", "110", "010", and "000" data, respectively. If these data are programmed in the memory cell transistors MT, the threshold voltages are raised up to corresponding verify voltages ("AV", "BV", "CV", "DV", "EV", "FV", and "GV" in FIG. 9 (2)).

In a second write operation, the "ER" level is divided into four levels ("ER", "A", "B", and "C"), and the "LM" level is also divided into four levels ("D", "E", "F", and "G"). Therefore, eight groups of threshold voltage distributions are formed in total.

The above-described group classification in a second write operation in the semiconductor memory 10 according to the first embodiment may be described with different expressions as follows.

For example, by executing a classifying verification operation, the sequencer 14 classifies a plurality of memory cell transistors MT to which data of the "D" level should be written to into a plurality of subgroups, in accordance with a result of a first write operation.

Specifically, the sequencer 14 first associates a plurality of memory cell transistors MT to which data of the "A" level, the "B" level, and the "C" level should be respectively written with a first group, and associates a plurality of memory cell transistors MT to which data of the "E" level, the "F" level, and the "G" level should be respectively written with a second group.

The sequencer 14 then associates one subgroup of the memory cell transistors MT to which data of the "D" level should be written with the first group, and another subgroup of the memory cell transistors MT to which data of the "D" level should be written with the second group.

Subsequently, the sequencer 14 executes a program using a first pulse on the first group of the memory cell transistors MT, and a program using a second pulse on the second group of the memory cell transistors MT.

(Overall Flow of Write Operation)

FIG. 10 shows an example of a flow chart of a write operation in the memory system 1 according to the first embodiment. A variable "i" is introduced to explain FIG. 10 for the sake of brevity. The variable i is managed by, for example, the processor 21, and retained in the RAM 22.

In step S10, the memory controller 20 instructs the semiconductor memory 10 to execute a first write operation on a word line WLi (i=0) being selected. Then, the semiconductor memory 10 writes the lower page data received from the memory controller 20 in memory cell transistors MT coupled to the word line WL0.

In step S11, the memory controller 20 increments the variable i.

In step S12, the memory controller 20 instructs the semiconductor memory 12 to execute a first write operation on a word line WLi (i=1) being selected. Then, the semiconductor memory 10 writes the lower page data received from the memory controller 20 in memory cell transistors MT coupled to the word line WL1.

In step S13, the memory controller 20 instructs the semiconductor memory 10 to execute a second write operation on a word line WL(i−1) being selected. Then, the semiconductor memory 10 writes three pages of data to the memory cell transistors MT0 coupled to the word line WL0, based on the middle page data and the upper page data received from the memory controller 20 and the lower page data received from the memory cell transistors MT associated with the selected word line WLsel.

In step S14, the memory controller 20 determines if the variable i becomes, for example, "7". The determined value "7" is set based on the number of the word lines WL provided in a block BLK, and can be changed discretionarily.

If the variable i does not become "7" in step S14 (NO in step 14), the memory controller 20 returns to the processing in step S11. In other words, the memory controller 20 increments the variable i, and orders the semiconductor memory 10 to execute a first write operation on a word line WLi being selected and a second write operation on a word line WL(i−1) being selected. In step S14, if the variable i is "7" (YES in S14), the memory controller 20 proceeds to the processing in step S15.

In step S15, the memory controller 20 instructs the semiconductor memory 10 to execute a second write operation on a word line WLi (i=7) being selected. Then, the semiconductor memory 10 writes three pages of data to the memory cell transistors MT7 coupled to the word line WL7 based on the middle page data and the upper page data received from the memory controller 20 and the lower page data received from the memory cell transistors MT associated with the selected word line WLsel.

A series of the operations as described above corresponds to a write operation for one block BLK. The memory controller 20 hereafter selects a different block BLK, and instructs the semiconductor memory 10 to iterate the same operation. The memory controller 20 then orders the semiconductor memory 10 to store all the write data received from, for example, a host device 30, and then finishes the write operation.

A write operation in the memory system 1 according to the first embodiment described above can also be described as follows from the view point of the semiconductor memory 10, focusing on one word line WL.

Upon receiving the lower page data from an external device, the semiconductor memory 10 executes a first write operation to write the lower page data to a plurality of memory cell transistors MT.

Upon further receiving the middle page data and the upper page data from an external device, the semiconductor memory 10 applies a predetermined voltage LMR to a selected word line WLsel to read the lower page data from a plurality of memory transistors MT, and applies a voltage DIV higher than the predetermined voltage LMR to the selected word line Wsel to monitor the threshold voltage distributions of "D" level memory cells after the first write operation.

The sequencer 14 then classifies a plurality of memory cell transistors MT to which data of the "D" level should be written into a plurality of subgroups based on a result of the monitoring. After the classification, the sequencer 14 writes multiple-bit data to a plurality of memory cell transistors MT based on the read-out lower page data, and the received middle page data and upper page data by executing a second write operation, which includes a latter-half program loop.

[1-3] Advantageous Effects of First Embodiment

According to the above-described semiconductor memory 10 in the first embodiment, reliability of data stored in the memory cells can be improved. Advantageous effects of the semiconductor memory 10 according to the first embodiment will be described in detail below.

The memory controller 20 in the memory system 1 may instruct the semiconductor memory 10 to execute a two-stage write operation when storing multiple-bit data in memory cells. In this case, in the first stage of the write operation, the memory system 1 roughly forms two groups of threshold distributions, using, for example, lower page data. In the second stage of the write operation, the memory system 1 executes a double-pulse program operation using different program pulses respectively for the memory cells programmed at high thresholds and the memory cells programmed at low thresholds during the first stage of the write operation.

For example, suppose if a TLC scheme is adopted as a write scheme, at the second stage of the write operation, the memory cells to be programmed to the "A" level, the "B" level, and the "C" level are programmed by a first pulse, and the memory cells to be programmed to the "D" level, the "E" level, the "F" level, and the "G" level are programmed by a second pulse with a voltage higher than the first pulse. In this case, the number of the levels targeted for programming by a first pulse is different from a second pulse. Therefore, "C"-level verification and "G" level verification may pass at different timings, since "C" level verification pass is a result of iterating the first pulse, and "G" level verification pass is a result of iterating the second pulse.

Accordingly, the semiconductor memory 10 according to the first embodiment executes a classifying verification operation in the second stage of the write operation (a second write operation), and classifies memory cells to be programmed to the "D" level into a first group and a second group in accordance with their threshold voltages. The semiconductor memory 10 then executes a double-pulse program operation in which different program pulses are applied respectively to the first and second groups of the memory cells to be programmed to the "D" level.

Figure 11:
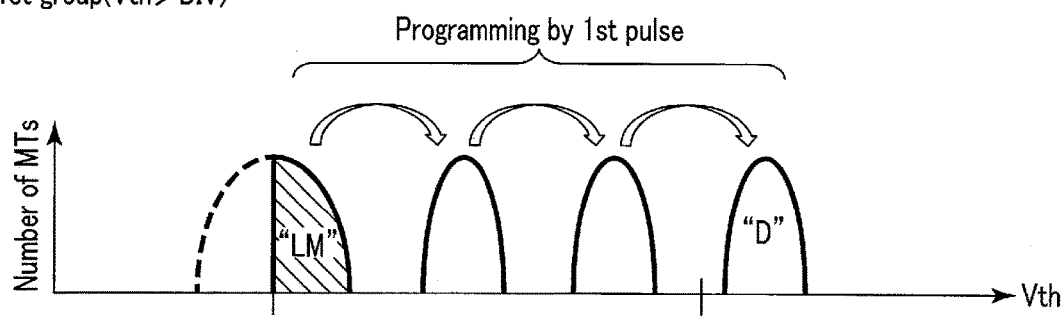
FIG. 11 is a diagram showing an example of evolution of threshold voltages of memory cell transistors targeted for "D"-level programming in a second write operation of the semiconductor memory according to the first embodiment.
Figure 11:
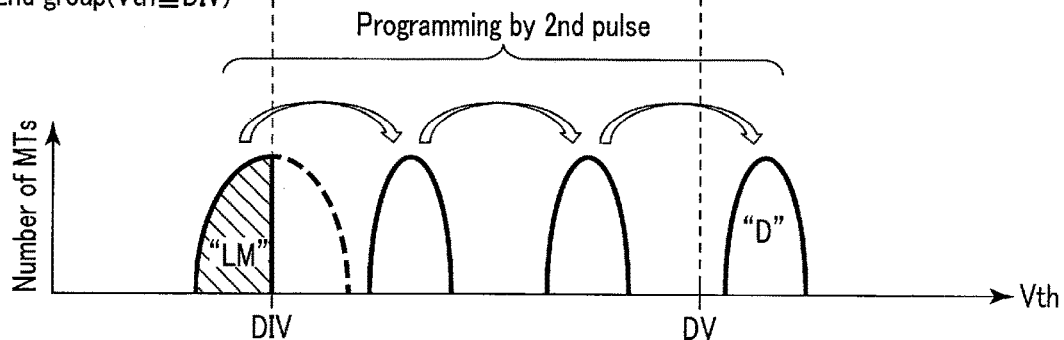

FIG. 11 shows an example of changes in the threshold voltages in the memory cells programmed to be the "D" level in a second write operation. As shown in FIG. 11 (1), in the second write operation, the first group of the "D"-level memory cells, which have threshold voltages higher than the verify voltage DIV, are programmed by a first pulse. As shown in FIG. 11 (2), on the other hand, the second group of the "D"-level memory cells, which have threshold voltages lower than or equal to the verify voltage DIV, are programmed by a second pulse. As shown in FIGS. 11 (1) and (2), the step width of the threshold voltages increase caused by a first pulse is smaller than a second pulse.

In other words, the semiconductor memory 10 executes a program operation using a first pulse having a low program voltage to the first group having higher threshold voltages among the memory cells to be programmed to the "D" level, and executes a program operation using a second pulse having a high program voltage to the second group having lower threshold voltages among the memory cells to be programmed to the "D" level. Thus, when programming the memory cells to the "D" level, the semiconductor memory 10 according to the first embodiment can adjust the timing when threshold voltages of the memory cells in the first group exceed the verify voltage DV as a result of iterating the program by a first pulse, and adjust the timing when threshold voltages of the memory cells in the second group exceed the verify voltage DV as a result of iterating the program by a second pulse.

Furthermore, in a second write operation, the semiconductor memory 10 according to the first embodiment can adjust the number of levels to be programmed by a first pulse and the number of levels to be programmed by a second pulse to be the same. For example, in the semiconductor memory 10 according to the first embodiment, the "A level, the "B" level, the "C" level, and the first group of the "D" level are programmed by a first pulse, and the second group of the "D" level, the "E" level, the "F" level, and the "G" level are programmed by a second pulse. Thus, in a case where a double-pulse program operation is adopted in a two-stage write operation, the semiconductor memory 10 according to the first embodiment can adjust the timing of finishing a program by a first pulse and the timing of finishing a program by a second pulse to be the almost same timing.

As a result of the above, in a case where a double-pulse program operation is adopted in a two-stage write operation, the semiconductor memory 10 can suppress an influence of disturbance that is caused by a program pulse after finishing a program by another program pulse. Accordingly, the semiconductor memory 10 according to the first embodiment can improve reliability of data stored in the memory cells.

In the above description, an example of adopting a TLC scheme as a write scheme is described; however, the present embodiment is not limited thereto. For example, even when a QLC scheme is adopted as a write scheme, it is possible to execute the same operation as the operation described in the first embodiment. This example will be described below.

As shown in FIG. 3, in the QLC scheme, the number of threshold distributions formed from the "ER" level is fifteen in total. If a double-pulse scheme is adopted in a second write operation, for example, programs of the "A" level, the "B" level, the "C" level, the "D" level, the "E" level, the "F" level, and the "G" level are executed using a first pulse, and programs of the "H" level, the "I" level, the "J" level, the "K" level, the "L" level, the "M" level, the "N" level, and the "O" level are executed using a second pulse. Thus, the number of the levels programmed by one program pulse becomes greater than the number of the levels programmed by the other program pulse.

Accordingly, in a second write operation in the QLC scheme, the sequencer 14 executes a classifying verification operation for the memory cells targeted for the "H"-level programming, and classifies the memory cells to be programmed to the "H" level into a first group with higher threshold voltages and a second group with lower threshold voltages. In a double-pulse program operation, the sequencer 14 then programs the first group of the "H" level by a first pulse and the second group of the "H" level with a second pulse.

Thus, in the same manner as with the TLC scheme, in a second write operation in which the QLC scheme is adopted, the semiconductor memory 10 according to the first embodiment can adjust the number of levels to be programmed by a first pulse and the number of levels to be programmed by a second pulse to the same number. Accordingly, in the example in which the QLC scheme is adopted, in the same manner as with the TLC scheme, the semiconductor memory 10 according to the first embodiment can also improve reliability of data stored in the memory cells.

[2] Second Embodiment

The semiconductor memory 10 according to the second embodiment has a configuration similar to that of the semiconductor memory 10 according to the first embodiment. In a second write operation as explained in the first embodiment, the semiconductor memory 10 according to the second embodiment executes a classifying verification operation to classify the memory cell transistors MT targeted for the "C"-level and "E"-level programming, and executes a triple-pulse program operation. In the following, differences of the semiconductor memory 10 according to the second embodiment from the first embodiment will be described.

[2-1] Operation

In a first write operation in the semiconductor memory 10 according to the second embodiment, a verify voltage LMV is set in such a manner that threshold voltages of memory cell transistors MT that have passed verification do not significantly exceed a verify voltage CV. Since the other operations in a first write operation in the semiconductor memory 10 according to the second embodiment are the same as those in a first write operation in the semiconductor memory 10 according to the first embodiment, the description thereof is omitted.

Figure 12:
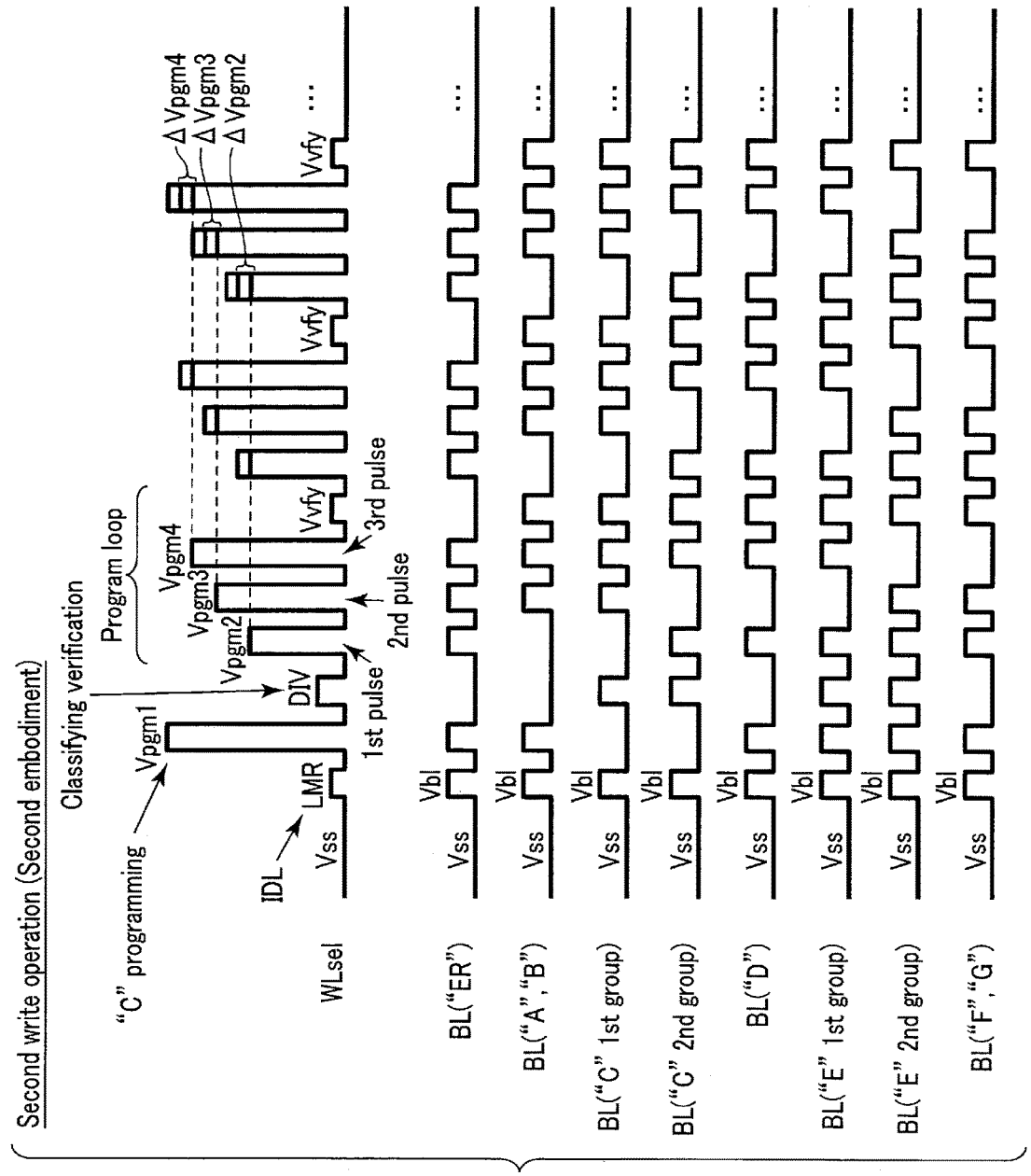
FIG. 12 is a diagram showing an example of voltages to be applied to different lines in a semiconductor memory in a second write operation according to a second embodiment.

FIG. 12 shows an example of a voltage of a selected word line WLsel, and voltages of bit lines BL corresponding to programs for each level in a second write operation in the semiconductor memory 10 according to the second embodiment. In an initial state before a second write operation is executed, a ground voltage Vss, for example, is applied to a word line WL and a bit line BL.

When the second write operation begins, the sequencer 14 first executes IDL, as shown in FIG. 12. In IDL, the sense amplifier module 17 applies a voltage Vbl to each bit line BL. The driver 15 and the row decoder 16 then apply a read voltage LMR to the selected word line WLsel. Subsequently, each sense amplifying unit SAU determines whether the threshold voltages of the corresponding memory cell transistors MT exceed the read voltage LMR, and the lower page data written by a first write operation is restored in a latch circuit in the sense amplifier module 17.

The sequencer 14 next executes a program operation for the memory cell transistors MT to be programmed to the "C" level. This program operation is executed to increase the threshold voltages of the memory cell transistors MT to be programmed to the "C" level from the "ER" level to the "LM" level. For example, the sequencer 14 sets the memory cell transistors MT to be programmed to the "ER" level, the "A" level, the "B" level, the "D" level, the "E" level, the "F" level, and the "G" level to program-disabled. The sequencer 14 sets the memory cell transistors MT to be programmed to the "C" level to program-enabled. The sense amplifier module 17 then applies a voltage Vbl to a program-disabled bit line BL, and a ground voltage Vss to a program-enabled bit line BL. The driver 15 and the row decoder 16 then apply a program voltage Vpgm1 to the selected word line WLsel. The voltage of the program pulse used in this program operation is not limited to a program voltage of Vpgm1, and may be changed. If a program voltage Vpgm1 is applied to the selected word line WLsel, an increase of the threshold voltages is suppressed by, for example, channel boosting in the program-disabled memory cell transistors MT, and the threshold voltages of the program-enabled memory cell transistors MT are increased by a potential difference between a control gate and a channel.

FIG. 12 shows an example of applying one program pulse Vpgm1; however, the embodiment is not limited thereto. For example, program loops similar to a first write operation may be adopted for a program operation executed for the memory cell transistors MT to be programmed to the "C" level. In other words, the program operation suffices its need if threshold voltages of the memory cell transistors MT to be programmed to the "C" level are increased to the "LM" level.

Subsequently, the sequencer 14 executes a classifying verification operation. In a classifying verification operation in the second embodiment, a plurality of memory cell transistors MT which are targeted for the "C"-level programming and a plurality of memory cell transistors MT which are targeted for the "E"-level programming are classified into a first group with higher threshold voltages and a second group with lower threshold voltages.

In a classifying verification operation, the sense amplifier module 17 applies a voltage Vbl to a bit line BL that corresponds to the memory cell transistors MT to be programmed to the "C" level and the "E" level, and applies a voltage Vss to the other bit lines BL. The driver 15 and the row decoder 16 then apply a verify voltage DIV to the selected word line WLsel. Subsequently, each sense amplifying unit SAU determines whether the threshold voltages of the memory cell transistors MT that are targeted for the "C"-level programming and the "E"-level programming exceed a verify voltage DIV or not, and the sequencer 14 classifies the memory cell transistors MT into the first group and the second group in accordance with a value of the threshold voltage.

The sequencer 14 then executes a program operation in a triple-pulse scheme based on the middle page data and upper page data stored in the sense amplifier module 17 and the lower page data read from the memory cell transistors MT.

First, the sequencer 14 executes a program operation using a first pulse. For example, the sequencer 14 sets the memory cell transistors MT which are to be programmed to the "ER" level, the "D" level, the "E" level, the "F" level, and the "G" level, and the second group of the memory cell transistors MT which are to be programmed to the "C" level, to program-disabled. The sequencer 14 sets memory cell transistors MT to be programmed to the "A" level and the "B" level, and the first group of the memory cell transistors MT to be programmed to the "C" level, to program-enabled.

The sense amplifier module 17 then applies a voltage Vbl to a program-disabled bit line BL, and a ground voltage Vss to a program-enabled bit line BL. The driver 15 and the row decoder 16 then apply a first pulse to the selected word line WLsel. The voltage of the first pulse in the initial program loop is a second program voltage Vpgm2, and the program voltage Vpgm2 is set lower than a first program voltage Vpgm1 in a first write operation, similarly to the first embodiment. When a first pulse is applied to the selected word line WLsel, the threshold voltage increase of the program-disabled memory cell transistors MT is suppressed by channel boosting, for example, and the threshold voltages of the program-enabled memory cell transistors MT are increased by a potential difference between a control gate and a channel.

Next, the sequencer 14 executes a program operation using a second pulse. For example, the sequencer 14 sets the memory cell transistors MT to be programmed to the "ER" level, the "A" level, the "B" level, the "F" level, and the "G" level, the first group of the memory cell transistors MT which are to be programmed to the "C" level, and the second group of the memory cell transistors MT which are to be programmed to the "E" level, to program-disabled. The sequencer 14 sets, for example, the memory cell transistors MT which are to be programmed to the "D" level, the second group of the memory cell transistors MT which are to be programmed to the "C" level, and the first group of the memory cell transistors MT which are to be programmed to the "E" level, to program-enabled.

The sense amplifier module 17 then applies a voltage Vbl to a program-disabled bit line BL, and a ground voltage Vss to a program-enabled bit line BL. The driver 15 and the row decoder 16 then apply a second pulse to the selected word line WLsel. The voltage of the second pulse in the initial program loop is a third program voltage Vpgm3, and the program voltage Vpgm3 is set higher than a second program voltage Vpgm2. When a second pulse is applied to the selected word line WLsel, the threshold voltage increase of the program-disabled memory cell transistors MT is suppressed by channel boosting, for example, and the threshold voltages increase of the program-enabled memory cell transistors MT are increased by a potential difference between a control gate and a channel.

Next, the sequencer 14 executes a program operation using a third pulse. For example, the sequencer 14 disables programming on the memory cell transistors MT of the "ER" level, the "A" level, the "B" level, the "C" level, the "D" level, and the first group of the "E" level. On the other hand, the sequencer 14 enables programming on the memory cell transistors MT of the "F" level, the "G" level, and the second group of the "E" level.

The sense amplifier module 17 then applies a voltage Vbl to program-disabled bit lines BL, and a ground voltage Vss to program-enabled bit lines BL. The driver 15 and the row decoder 16 then apply a third pulse to the selected word line WLsel. The voltage of the third pulse in the initial program loop is a fourth program voltage Vpgm4, and the program voltage Vpgm4 is set higher than a third program voltage Vpgm3. When a third pulse is applied to the selected word line WLsel, the threshold voltage increase of the program-disabled memory cell transistors MT is suppressed by channel boosting, for example, and the threshold voltages of the program-enabled memory cell transistors MT are increased by a potential difference between a control gate and a channel.

Next, the sequencer 14 executes a verification operation. Since the verification operation is the same as the verification operation in the second write operation that is described in the first embodiment, a detailed description of the verification operation is omitted.

A set of a triple-pulse program operation using a first pulse, a second pulse, and a third pulse, and a verification operation explained above constitutes one program loop. The sequencer 14 iteratively executes the program loop, and steps up a program voltage Vpgm2 by ΔVpgm2, a program voltage Vpgm3 by ΔVpgm3, and a program voltage Vpgm4 by ΔVpgm4 every program loop. Each of ΔVpgm2, ΔVpgm3, and ΔVpgm4 is set to be smaller than ΔVpgm1 in a first write operation, which is described in the first embodiment.

When the sequencer 14 then detects an excess in the number of memory cell transistors MT that have passed, for example, all verification over a predetermined number, the sequencer 14 finishes the second write operation. Since the other operations in the semiconductor memory 10 according to the second embodiment are the same as those in the semiconductor memory 10 as described in the first embodiment, a detailed description of the operations is omitted.

Figure 13:
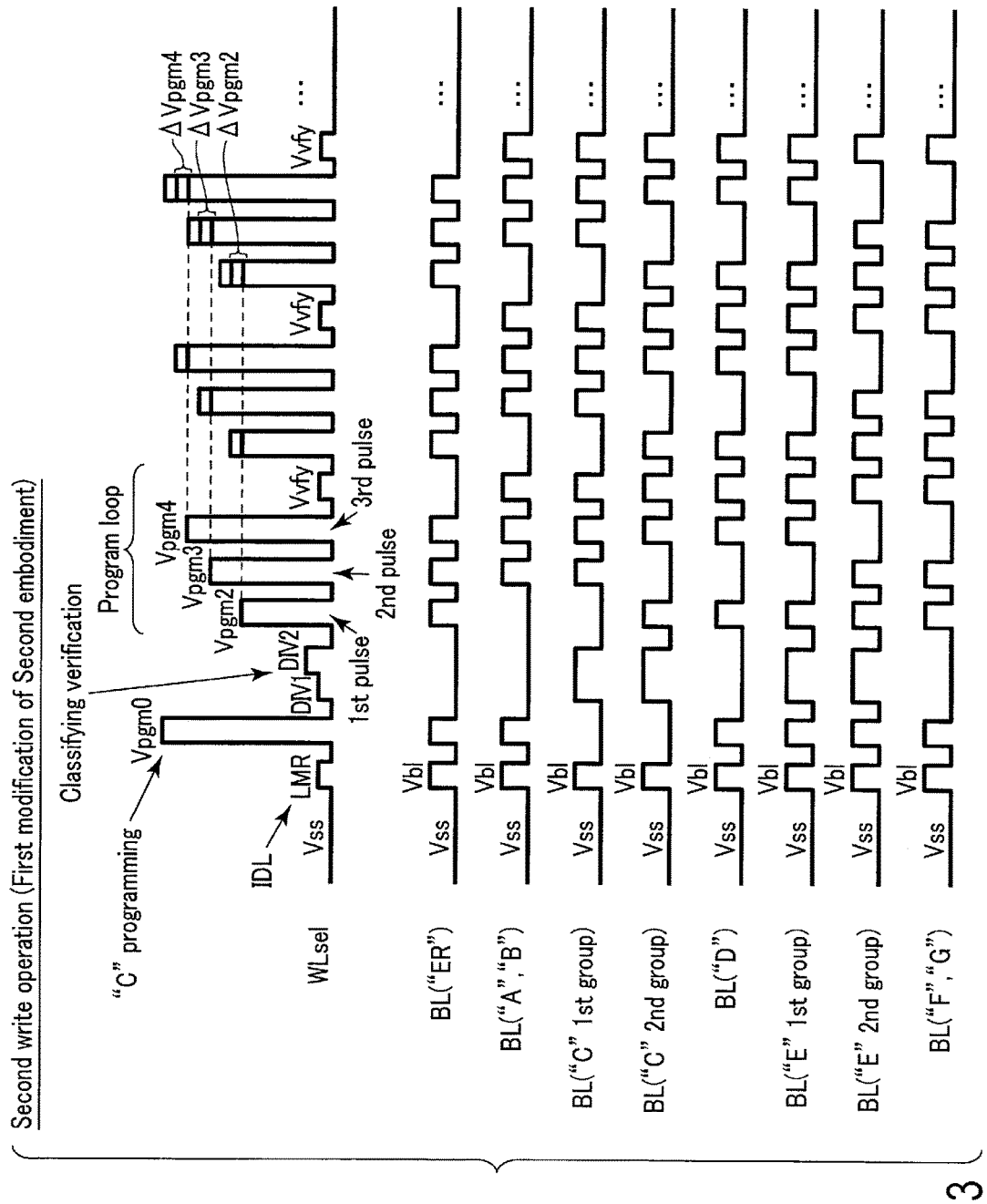
FIG. 13 is a diagram showing an example of voltages to be applied to different lines in the semiconductor memory in a second write operation according to a first modification of the second embodiment.

In a second write operation in the second embodiment as described above, a classifying verification operation for the "C" level and a classifying verification operation for the "E" level may be executed with different verify voltages. FIG. 13 shows an example of voltages to be applied to the selected word line and bit lines of each level in a second write operation in the semiconductor memory according to the first modification of the second embodiment. In FIG. 13, a value of the program voltage used in a program operation executed between IDL and a classifying verification operation, and the details of the classifying verification operation are different from those shown in FIG. 12.

For example, in the first modification of the second embodiment, a program operation executed between IDL and a classifying verification, a program voltage Vpgm0 is used for example, as shown in FIG. 13. A value of the program voltage Vpgm0 can be set discretionarily as long as it is lower than the program voltage Vpgm1. In a program operation executed between IDL and a classifying verification in the present modification, similarly to the second embodiment, program loops including a verification operation may be executed two or more times, or program pulses may be applied two or more times.

In a classifying verification operation in the first modification of the second embodiment, a verification operation using two different verify voltages is executed. For example, in the classifying verification operation, a verify voltage DIV1 used for classifying the memory cell transistors MT to be programmed at the "C" level, and a verify voltage DIV2 used for classifying the memory cell transistors MT to be programmed at the "E" level are used. The verify voltage DIV1 is lower than the verify voltage DIV2.

In a classifying verification operation in the first modification of the second embodiment, the sense amplifier module 17 applies a voltage Vbl to a bit line BL corresponding to the memory cell transistors MT to be programmed to the "C" level and the "E" level, and applies a voltage Vss to the other bit lines BL. The driver 15 and the row decoder 16 then sequentially apply verify voltages DIV1 and DIV2 to a selected word line WLsel, and each sense amplifying unit SAU determines whether threshold voltages of the memory cell transistors MT targeted for the "C"-level programming exceed the verify voltage DIV1 or not, and determines whether threshold voltages of the memory cell transistors MT targeted for the "E"-level programming exceed the verify voltage DIV2.

The sequencer 14 then classifies, based on results of the determinations, the memory cell transistors MT to be programmed to the "C" level and the memory cell transistors MT to be programed to the "E" level into the first group and the second group, in accordance with the values of threshold voltages. Since the other operations in the first modification of the second embodiment are the same as a second write operation in the second embodiment, a detailed description of the operations is omitted.

The above-described group classification in a second write operation in the semiconductor memory 10 according to the second embodiment can be restated as in the following.

For example, by executing a classifying verification operation, the sequencer 14 classifies a plurality of memory cell transistors MT to which data of the "C" level and the "E" level should be written into multiple subgroups, in accordance with a result of a first write operation or a result of a program operation executed between IDL and a classifying verification.

Specifically, the sequencer 14 first associates a plurality of memory cell transistors MT to which data of the "A" level and "B" level should be respectively written with a first group of memory cell transistors MT, associates a plurality of memory cell transistors MT to which data of the "D" level should be written with a second group of memory cell transistors MT, and associates a plurality of memory cell transistors MT to which data of the "F" level and "G" level should be respectively written with a third group of memory cell transistors MT.

The sequencer 14 then associates one subgroup of the memory cell transistors MT to which data of the "C" level should be written with the first group, and another subgroup of the memory cell transistors MT to which data of the "C" level should be written with the second group.

The sequencer 14 further associates one subgroup of the memory cell transistors MT to which data of the "E" level should be written with the second group, and another subgroup of the memory cell transistors MT to which data of the "E" level should be written with the third group.

Subsequently, the sequencer 14 executes a program using a first pulse on the memory cell transistors MT of the first group, a program using a second pulse on the memory cell transistors MT of the second group, and a program using a third pulse on the memory cell transistors MT of the second group.

[2-2] Advantageous Effects of Second Embodiment

According to the above-described semiconductor memory 10 in the second embodiment, reliability of data stored in the memory cells can be improved similarly to the first embodiment. Advantageous effects of the semiconductor memory 10 according to the second embodiment will be described in detail below.

The memory system 1 is capable of executing a triple-pulse program operation in a two-stage write operation. In a triple-pulse scheme, three different program pulses are used in accordance with the values of thresholds to be programmed. In the memory system 1, even in a triple-pulse program operation, for a reason similar to the double-pulse scheme described in the first embodiment, the timing when memory cells pass verification may be different depending on the program pulses.

In this case, the semiconductor memory 10 according to the second embodiment executes a classifying verification operation in the second stage of the write operation (a second write operation), and classifies memory cells to be programmed to the "C" level and the "E" level into a first group and a second group in accordance with their threshold voltages. In the second write operation, the semiconductor memory 10 then executes programming using different program pulses for the first group and the second group.

Figure 14:
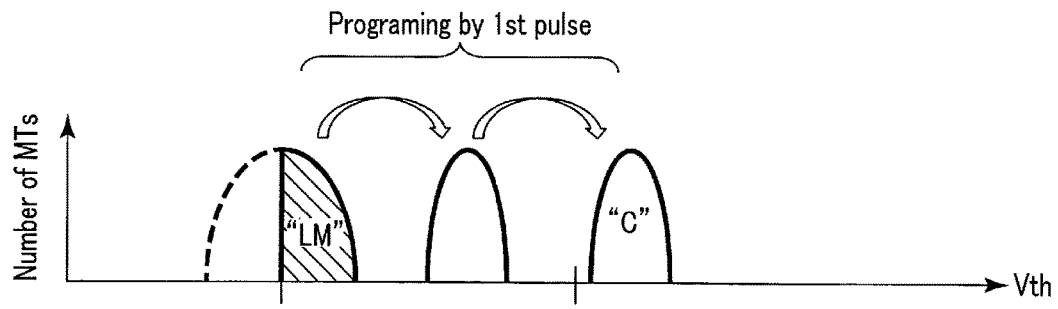
FIG. 14 is a diagram showing an example of evolution of threshold voltages of memory cell transistors targeted for "C"-level programming in a second write operation of the semiconductor memory according to the second embodiment.
Figure 14:
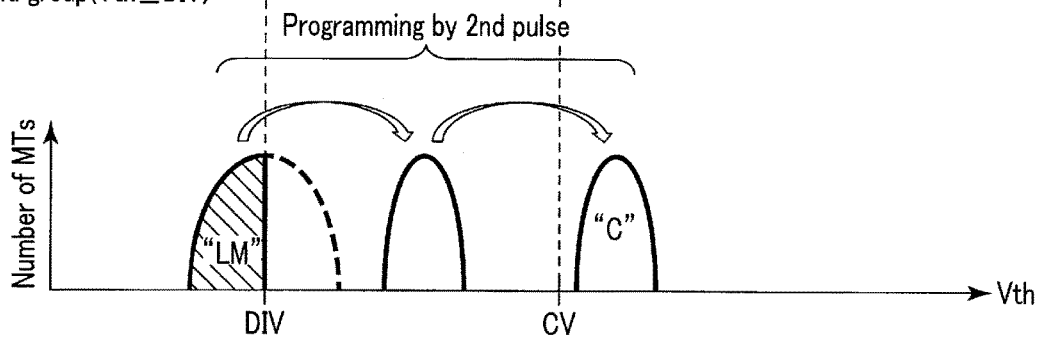

FIG. 14 shows an example of evolution of the threshold voltages in the memory cells programmed to be the "C" level in a second write operation. As shown in FIG. 14 (1), the first group of the "C"-level memory cells, which have threshold voltages higher than the verify voltage DIV (or DIV1), are programmed by a first pulse. On the other hand, the second group of the "C"-level memory cells, which have threshold voltages lower than the verify voltage DIV (or DIV1), are programmed by a second pulse. As shown in FIGS. 14 (1) and (2), the step width of the threshold voltage increase caused by a first pulse is smaller than a second pulse.

Figure 15:
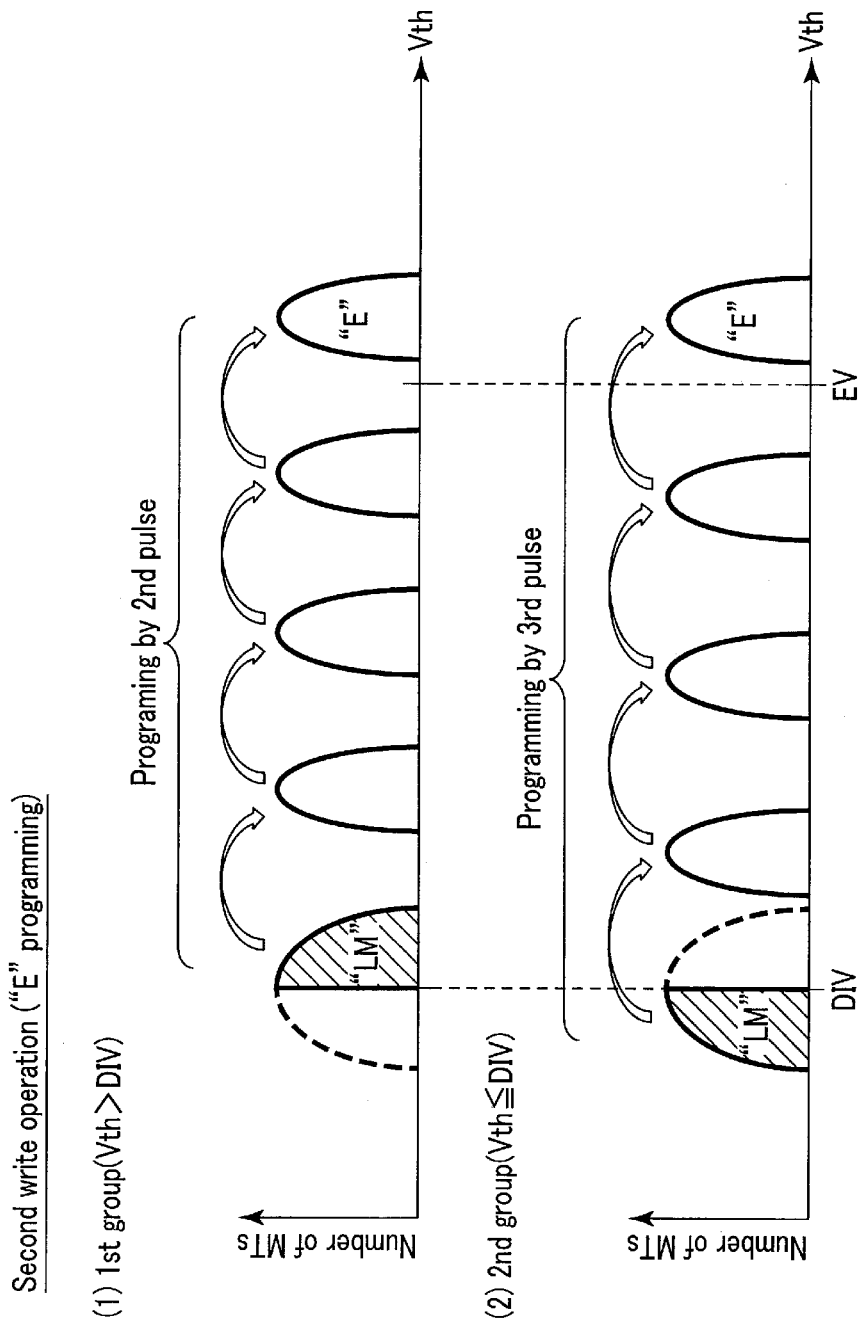
FIG. 15 is a diagram showing an example of evolution of threshold voltages of memory cell transistors targeted for "E"-level programming in a second write operation of the semiconductor memory according to the second embodiment.

FIG. 15 shows an example of evolution of the threshold voltages of the memory cells programmed to be the "E" level in a second write operation. As shown in FIG. 15 (1), the first group of the "E"-level memory cells, which have threshold voltages higher than the verify voltage DIV (or DIV2), are programmed by a second pulse. On the other hand, the second group of the "E"-level memory cells, which have threshold voltages lower than the verify voltage DIV (or DIV2), are programmed by a third pulse. As shown in FIGS. 15 (1) and (2), the step width of the threshold voltage increase caused by a second pulse is smaller than a third pulse.

As described above, the semiconductor memory 10 executes programming using a first pulse having a low program voltage to the group having high threshold voltages among the memory cells to be programmed to the "C" level, and executes programming using a second pulse having a high program voltage to the group having low threshold voltages among the memory cells to be programmed to the "C" level. The semiconductor memory 10 executes programming using a second pulse having a low program voltage to the group having high threshold voltages among the memory cells to be programmed to the "E" level, and executes programming using a third pulse having a high program voltage to the group having low threshold voltages among the memory cells to be programmed to the "E" level.

Thus, in the memory cells to be programmed to the "C" level, the semiconductor memory 10 according to the second embodiment can adjust the timing when the verify voltage CV is exceeded as a result of iterating the programming by a first pulse, and the timing when the verify voltage CV is exceeded as a result of iterating the programming by a second pulse. Thus, in the memory cells to be programmed to the "E" level, the semiconductor memory 10 can adjust the timing when the verify voltage EV is exceeded as a result of iterating programming by a second pulse and the timing when the verify voltage EV is exceeded as a result of iterating programming by a third pulse to be the same timing.

In a second write operation, the semiconductor memory 10 according to the second embodiment can adjust the number of levels programmed by a first pulse, the number of levels programmed by a second pulse, and the number of levels programmed by a third pulse to be the same. For example, in the semiconductor memory 10 according to the second embodiment, the "A level, the "B" level, and the first group of the "C" level are programmed by a first pulse, the second group of the "C" level, the "D" level, the first group of the "E" level are programmed by a second pulse, and the second group of the "E" level, the "F" level, and the "G" level are programmed by a third pulse. Thus, in a case where a triple-pulse program operation is adopted in a two-stage write operation, the semiconductor memory 10 according to the second embodiment can adjust the timing of finishing programming by a first pulse, the timing of finishing programming by a second pulse, and the timing of finishing programming by a third pulse to be the almost same timing.

As a result of the above, in a case where a triple-pulse program operation is adopted in a two-stage write operation, the semiconductor memory 10 can suppress an influence of disturbance caused by one program pulse after finishing programming by the other program pulses. Thus, the semiconductor memory 10 in the second embodiment can improve reliability of data stored in the memory cells, similar to the first embodiment.

[3] Third Embodiment

The semiconductor memory 10 according to the third embodiment has a configuration similar to that of the semiconductor memory 10 according to the first embodiment. In the semiconductor memory 10 according to the third embodiment, a classifying verification operation, which is described in the first embodiment, is inserted into the middle of a full-sequence write operation, and a double pulse scheme is partially adopted from the middle of a write operation. In the following, differences of the semiconductor memory 10 according to the third embodiment from the first and second embodiments will be described.

[3-1] Operation

In the memory system 1 according to the third embodiment, the memory controller 20 instructs the semiconductor memory 10 to execute a full-sequence write operation to write data received from a host device 30. A full-sequence write operation is a write operation in a TLC scheme or another to write multi-bit data to memory cell transistors MT in one sequential step-up programming. Desired threshold distributions in one word line can be formed by executing one iterative write operation. Hereinafter, a full-sequence write operation executed by the semiconductor memory 10 will be referred to as a third write operation.

FIG. 16 shows an example of a flow chart of a third write operation in the semiconductor memory 10 according to the third embodiment. In the explanation of FIG. 16 below, a variable "j" is introduced for the sake of brevity. The variable j is managed by a counter in the sequencer 14, for example.

In step S20, the sequencer 14 resets the counter (j=0). In step S21, the sequencer 14 executes a program operation in a single pulse scheme. In step S22, the sequencer 14 executes a verification operation. In step S23, the sequencer 14 determines if the value of the counter reaches "k" or not. The value "k" is an integer greater than or equal to 1 and can be set discretionarily.

In step S23, if the value of the counter does not equal "k" (NO in step S23), the sequencer 14 proceeds to step S24. In step S24 and step S25, the sequencer 14 steps up a program voltage, increments the value of the counter, and proceeds to the operation in step S21. In other words, the sequencer 14 executes a program loop including a single-pulse program operation and a verification operation once again. In the following descriptions, a program loop executed in the first half of the write operation will be referred to as a first-half program loop.

If the value of the counter equals "k" in step S23 (YES in step S23), the sequencer 14 proceeds to step S26. In step S26, the sequencer 14 executes a classifying verification operation. This classifying verification operation is the same as that executed in the second write operation described in the first embodiment, and this operation classifies the memory cell transistors MT targeted for the "D" level programming into the first group with high threshold voltages and the second group with low threshold voltages.

In step S27, the sequencer 14 executes a double-pulse program operation. In step S28, the sequencer 14 executes a verification operation. In step S29, the sequencer 14 determines if the number of the memory cell transistors MT that have passed verification at each level exceeds a number predetermined for each level.

If the memory cell transistors MT have not passed verification at each level (NO in step S29), the sequencer 14 proceeds to step S30. In step S30, the sequencer 14 steps up a program voltage, and proceeds to the operation in step S27. In other words, the sequencer 14 executes a program loop including a double-pulse program operation and a verification operation once again. In the following, a program loop that is executed in the latter half of the write operation will be referred to as a latter-half program loop. If the memory cell transistors MT have passed verification at each level (YES in step S29), the sequencer 14 finishes the third write operation and changes the state of the semiconductor memory 10 to a ready state.

A sequential operation described above corresponds to a write operation for one word line WL. The memory controller 20 hereafter selects a different word line WL, and instructs the semiconductor memory 10 to do the same operation. The memory controller 20 then orders the semiconductor memory 10 to store all the write data received from a host device 30, for example, and then finishes the write operation.

Figure 17:
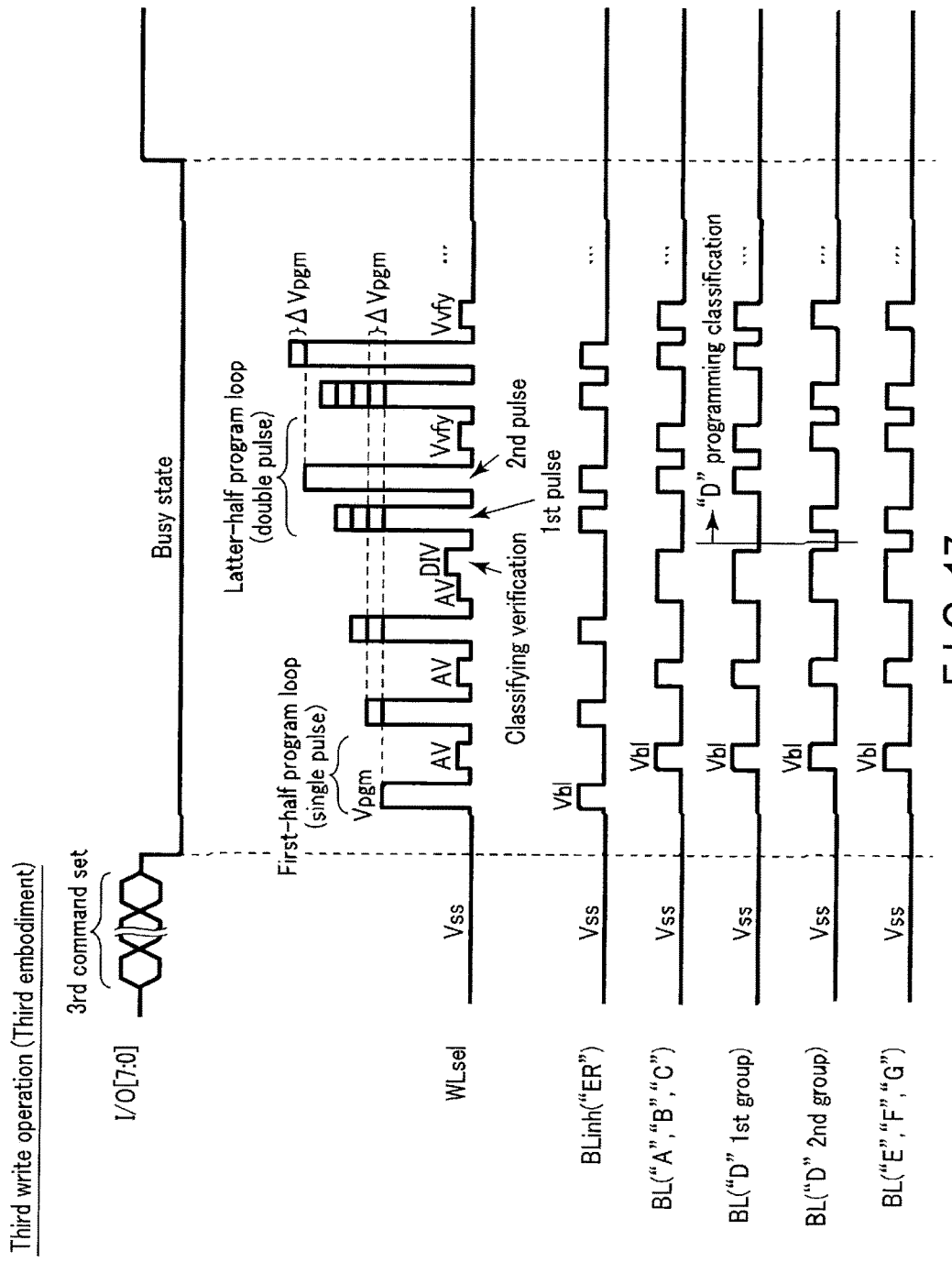
FIG. 17 is a diagram showing an example of voltages to be applied to different lines in the semiconductor memory in a third write operation according to the third embodiment.

FIG. 17 shows an example of a state of the input/output signal I/O, a voltage of a selected word line WLsel, and voltages of bit lines BL corresponding to programs for each level in the semiconductor memory 10 in a third write operation according to the third embodiment. The following example is a case where the value "k" in FIG. 16 is set to 2. In an initial state before a third write operation is executed, a ground voltage Vss is applied to the word line WL and the bit line BL, for example.

As shown in FIG. 17, the memory controller 20 transmits a third command set to the semiconductor memory 10. The third command set includes a command for instructing the semiconductor memory 10 to execute a third write operation, lower page data, middle page data, and upper page data.

The lower page data, middle page data, and upper page data are stored in a latch circuit provided within the sense amplifier module 17. The semiconductor memory 10 is then turned to a busy state, and executes a third write operation, using the lower, middle, and upper page data stored in the sense amplifier module 17. The semiconductor memory 10 may possibly turn to a busy state while it is still receiving the third command set.

When the third write operation begins, the sequencer 14 first executes a single-pulse program operation. For example, the sequencer 14 disables programming on the memory cell transistors MT of "ER" level. On the other hand, the sequencer 14 enables programming on the memory cell transistors MT of the "A" level, the "B" level, the "C" level, the "D" level, the "E" level, the "F" level, and the "G" level.

The sense amplifier module 17 then applies a voltage Vbl to program-disabled bit lines BL, and a ground voltage Vss to program-enabled bit lines BL. The driver 15 and the row decoder 16 then apply a program voltage Vpgm to the selected word line WLsel, for example. The program voltage Vpgm is high enough to increase a threshold voltage of a memory cell transistor MT. When a program voltage Vpgm is applied to the selected word line WLsel, the threshold voltage increase of the program-disabled memory cell transistors MT is suppressed by channel boosting, and the threshold voltages of the program-enabled memory cell transistors MT are increased by a potential difference between a control gate and a channel.

Next, the sequencer 14 executes a verification operation. In a verification operation, the sense amplifier module 17 applies a voltage Vss to a program-disabled bit line BL, and a voltage Vbl to a program-enabled bit line BL, for example. The driver 15 and the row decoder 16 then apply a verify voltage AV to the selected word line WLsel. Each sense amplifying unit SAU determines whether or not the threshold voltages of the corresponding memory cell transistors MT exceed the verify voltage AV, and the sequencer 14 sets the bit line BL that has passed verification to program-disabled in program operations executed thereafter.

A set of a single-pulse program operation and a verification operation as explained above constitutes one first-half program loop. The sequencer 14 iteratively executes the program loops, and steps up a program voltage Vpgm by ΔVpgm in each program loop.

The sequencer 14 then executes a classifying verification operation after executing a first-half program loop for three times, for example. In a classifying verification operation, the sense amplifier module 17 applies a voltage Vbl to program-enabled bit lines BL. The driver 15 and the row decoder 16 then apply a verify voltage DIV to the selected word line WLsel. Subsequently, each sense amplifying unit SAU determines whether the threshold voltages of the memory cell transistors MT that are targeted for the "D"-level programming exceed a verify voltage DIV or not, and the sequencer 14 classifies the memory cell transistors MT into the first group and the second group in accordance with the value of threshold voltages.

Next, the sequencer 14 executes a double-pulse program operation based on the lower, middle, and upper page data retained in the sense amplifier module 17 and a result of the classifying verification operation. Since the double-pulse program operation is the same as the double-pulse program operation in the second write operation described in the first embodiment, a detailed description of the program operation is omitted. Subsequently, the sequencer 14 executes a verification operation similar to that in a second write operation described in the first embodiment.

In a double-pulse program operation in the third embodiment, a voltage of a first pulse is set to, for example, a sum of ΔVpgm and a program voltage applied in the program loop immediately before the program operation, and a voltage of a second pulse is set to, for example, a program voltage Vpgm3 applied as a second pulse in a first program loop executed in a second write operation in the first embodiment. A voltage of a second pulse is not limited thereto, as long as it is set to a voltage higher than a first pulse within the same program loop.

A set of a double-pulse program operation using a first pulse and a second pulse and a verification operation explained above constitutes one latter-half program loop. Hereafter, the sequencer 14 iteratively executes the latter-half program loops, and steps up a voltage of a first pulse and a voltage of a second pulse by ΔVpgm in each program loop. In the latter-half program loop, the step-up width of a first pulse voltage and the step-up width of a second pulse voltage may be different, and they can be discretionarily set.

If the sequencer 14 then detects an excess in the number of memory cell transistors MT that have passed verification over a predetermined number in each level, for example; the sequencer 14 finishes a third write operation and changes the state of the semiconductor memory 10 to a ready state.

As explained above, the number of times of applying a program pulse to a selected word line WLsel within a latter-half program loop is greater than the number of times of applying a program pulse to a selected word line WLsel within a first-half program loop in a third write operation. The first-half program loop includes a verification operation for determining whether writing data for the "A" level is finished or not in selected memory cells after applying a program pulse to a selected word line WLsel.

Figure 18:
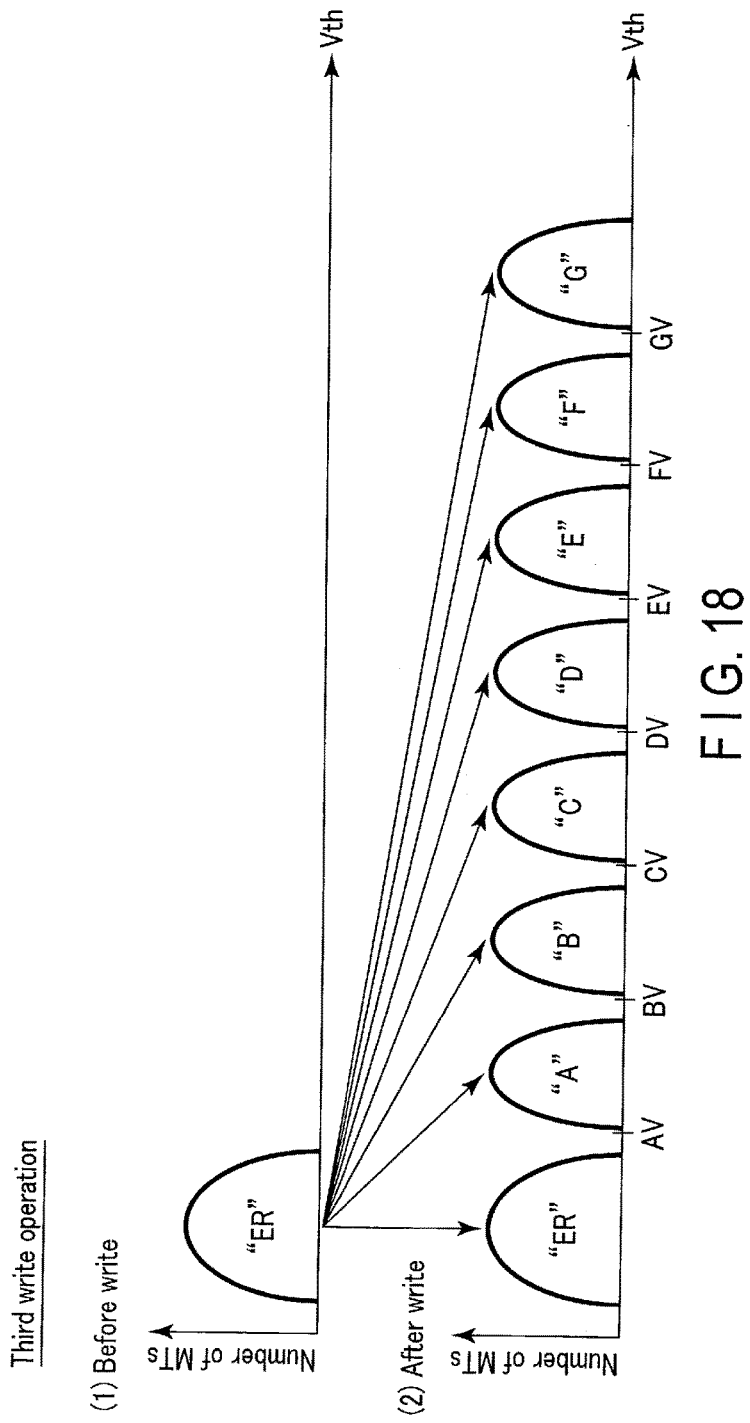
FIG. 18 is a diagram showing an example of a evolution of threshold distributions of memory cell transistors in a third write operation of the semiconductor memory according to the third embodiment.

FIG. 18 shows an example of evolution of the threshold distribution of the memory cell transistors MT in a third write operation of the semiconductor memory 10 according to the third embodiment. In FIGS. 18 (1) and (2) show threshold distributions of memory transistors MT before and after a third write operation is executed in the semiconductor memory 10.

As shown in FIG. 18 (1), threshold voltages of the memory cell transistors MT are distributed in the "ER" level before a third write operation is executed. As shown in FIG. 18 (2), after a third write operation is executed, the threshold distribution at the "ER"-level is divided into the "A" level, the "B" level, the "C" level, the "D" level, the "E" level, the "F" level, and the "G" level threshold distributions.

As described above, in a third write operation, eight groups of threshold distributions are formed from the threshold distributions at the "ER"-level. Since all the other operations in the semiconductor memory 10 according to the third embodiment are the same as those in the semiconductor memory 10 as described in the first embodiment, further detailed descriptions of the operations are omitted.

The above-described group classification in a third write operation in the semiconductor memory 10 according to the third embodiment can be restated as follows.

For example, by executing a classifying verification operation, the sequencer 14 classifies a plurality of memory cell transistors MT to which data of the "D" level should be written into a plurality of subgroups, in accordance with a result of a first-half program loop.

Specifically, the sequencer 14 first associates a plurality of memory cell transistors MT to which data of the "A" level, the "B" level, and the "C" level should be respectively written with a first group, and associates a plurality of memory cell transistors MT to which data of the "E" level, the "F" level, and the "G" level with a second group.

The sequencer 14 then associates one subgroup of the memory cell transistors MT to which data of the "D" level should be written with the first group, and another subgroup of the memory cell transistors MT to which data of the "D" level should be written with the second group.

Subsequently, the sequencer 14 executes programming using a first pulse on the first group of the memory cell transistors MT, and programming using a second pulse on the second group of the memory cell transistors MT.

[3-2] Advantageous Effects of Third Embodiment

As described above, in a full-sequence write operation, the semiconductor memory 10 according to the third embodiment first iteratively executes first-half program loops to which a single-pulse program operation is adopted. The semiconductor memory 10 then executes a classifying verification operation after executing first-half program loops for the predetermined number of times.

By executing a classifying verification operation in the middle of a write operation as described above, the semiconductor memory 10 can distinguish the memory cells with high threshold voltages from the memory cells with low threshold voltages among the memory cells to be programmed to the "D" level. In other words, similar to the first embodiment, the semiconductor memory 10 according to the third embodiment can classify the memory cells to be programmed to the "D" level into a first group with relatively high threshold voltages and a second group with relatively low threshold voltages.

The semiconductor memory 10 according to the third embodiment proceeds from a single-pulse program operation to a double-pulse program operation in the middle of a write operation. Specifically, in a double-pulse program operation, the first group of the "D"-level memory cells, which have high threshold voltages, are programmed using a first pulse having a low program voltage, and the second group of the "D"-level memory cells, which have low threshold voltages, are programmed using a second pulse having a high program voltage according to the third embodiment.

Thus, in the memory cells to be programmed to the "D" level, similarly to the first embodiment, the semiconductor memory 10 according to the third embodiment can adjust the timing when the memory cells pass verification as a result of iterating programming by a first pulse and the timing when the memory cells pass verification as a result of iterating programming by a second pulse to be the same. In a double-pulse program operation, similarly to the first embodiment, the semiconductor memory 10 according to the third embodiment can adjust the number of levels to be programmed by a first pulse and a second pulse to be the same.

As described above, in a full-sequence write operation, the semiconductor memory 10 according to the third embodiment can execute a double-pulse program operation in which the memory cell transistors MT of the "D"-level are classified similarly to the first embodiment.

Thus, in a case where a double-pulse program operation is adopted in the middle of a write operation, the semiconductor memory 10 according to the third embodiment can suppress an influence of disturbance caused by a program pulse after finishing a program by another program pulse. Thus, the semiconductor memory 10 in the third embodiment can improve reliability of data stored in the memory cells, similarly to the first embodiment.

[4] Fourth Embodiment

The semiconductor memory 10 according to the fourth embodiment has a configuration similar to that of the semiconductor memory 10 according to the first embodiment. In a third write operation as described in the third embodiment, the semiconductor memory 10 according to the fourth embodiment omits a classifying verification operation; instead, it uses a result of verification at the "A" level. In the following, differences of the semiconductor memory 10 according to the fourth embodiment from the first to third embodiments will be described.

[4-1] Operation

Figure 19:
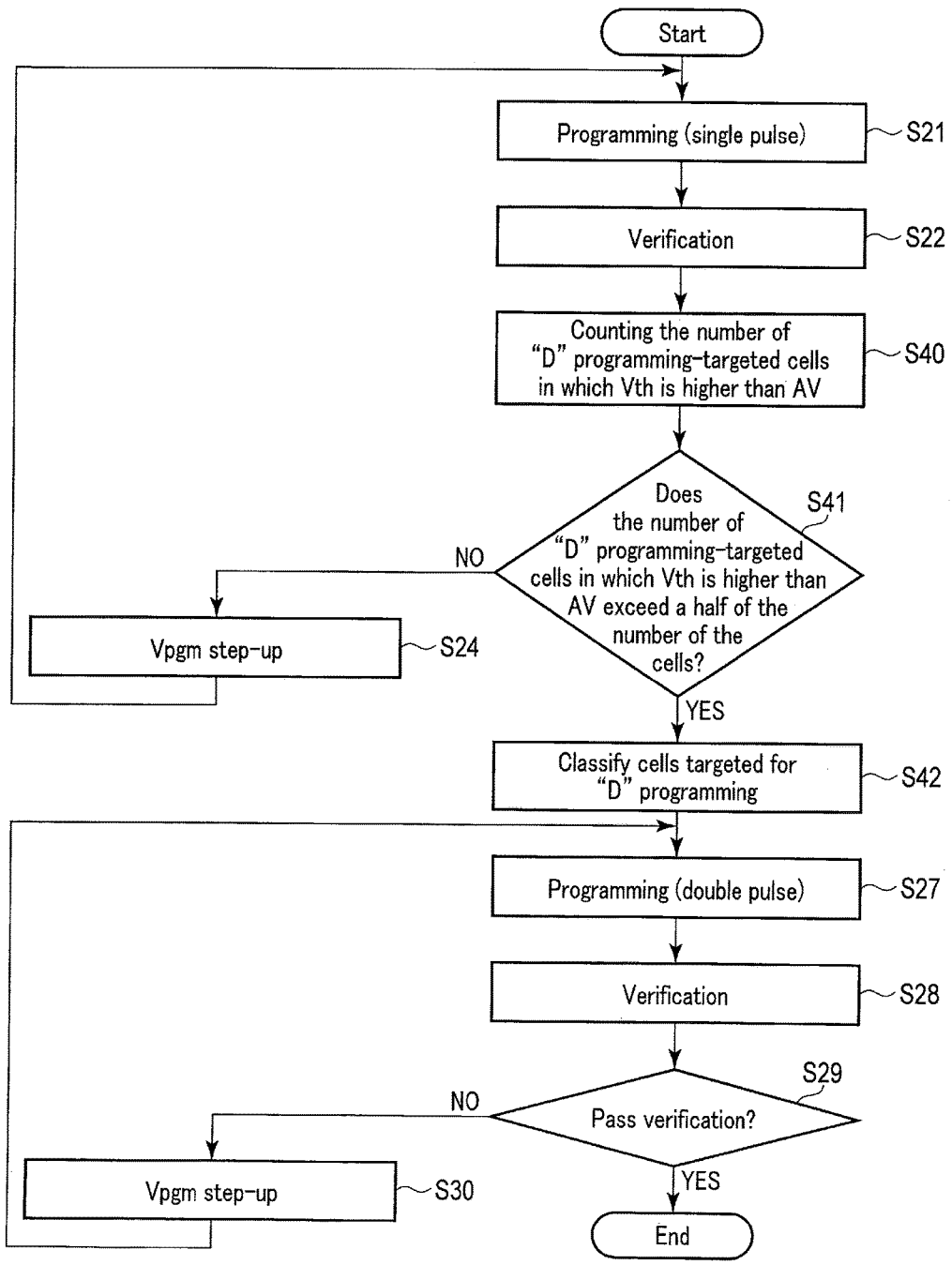
FIG. 19 shows an example of a flow chart of a third write operation in a semiconductor memory according to a fourth embodiment.

FIG. 19 shows an example of a flow chart of a third write operation in the semiconductor memory 10 according to the fourth embodiment. The flow chart shown in FIG. 19 is the same as the flow chart of FIG. 16, which is explained with reference to the third embodiment, except that the operations in step S23 and step S26 are replaced with steps S40, S41, and S42 and the operations in step S20 and step S25 are omitted.

In step S40, the sequencer 14 counts the number of the memory cell transistors MT in which a threshold voltage Vth exceeds a verify voltage AV among the memory cell transistors MT to be programmed to the "D" level. In step S41, the sequencer 14 determines whether or not the number of cells of which the threshold voltage Vth exceeds the verify voltage AV becomes greater than or equal to a half of the memory cell transistors MT to be programmed to the "D" level. This value for determination can be set at a given value.

In step S41, if the number of the cells of which the threshold voltage Vth exceeds the verify voltage AV is not greater than or equal to a half of the memory cell transistors to be programmed to the "D" level (NO in step S41), the sequencer 14 proceeds to step S24. In other words, the sequencer 14 steps up a program voltage Vpgm, and executes the program loop once again. In step S41, if the number of the cells in which the threshold voltage Vth exceeds the verify voltage AV is greater than or equal to a half of the memory cell transistors to be programmed to the "D" level (YES in step S41), the sequencer 14 proceeds to step S42.

In step S42, the sequencer 14 classifies the memory cell transistors MT to be programmed to the "D" level into a first group with high threshold voltages and a second group with low threshold voltages. Specifically, based on a result of immediately-preceding verification using the verify voltage AV, the sequencer 14 classifies the memory cell transistors MT of the "D" level into the first group if they pass verification using the verify voltage AV, and into the second group if they fail verification using the verify voltage AV.

The sequencer 14 then executes the operations in step S27 through step S30, and iteratively executes the latter-half program loops, which are explained in the third embodiment with reference to FIG. 16. If, in step S29, the sequencer 14 then detects an excess in the number of memory cell transistors MT that have passed verification over the predetermined number in each level, for example, the sequencer 14 finishes the third write operation and changes the semiconductor memory 10 to a ready state.

Figure 20:
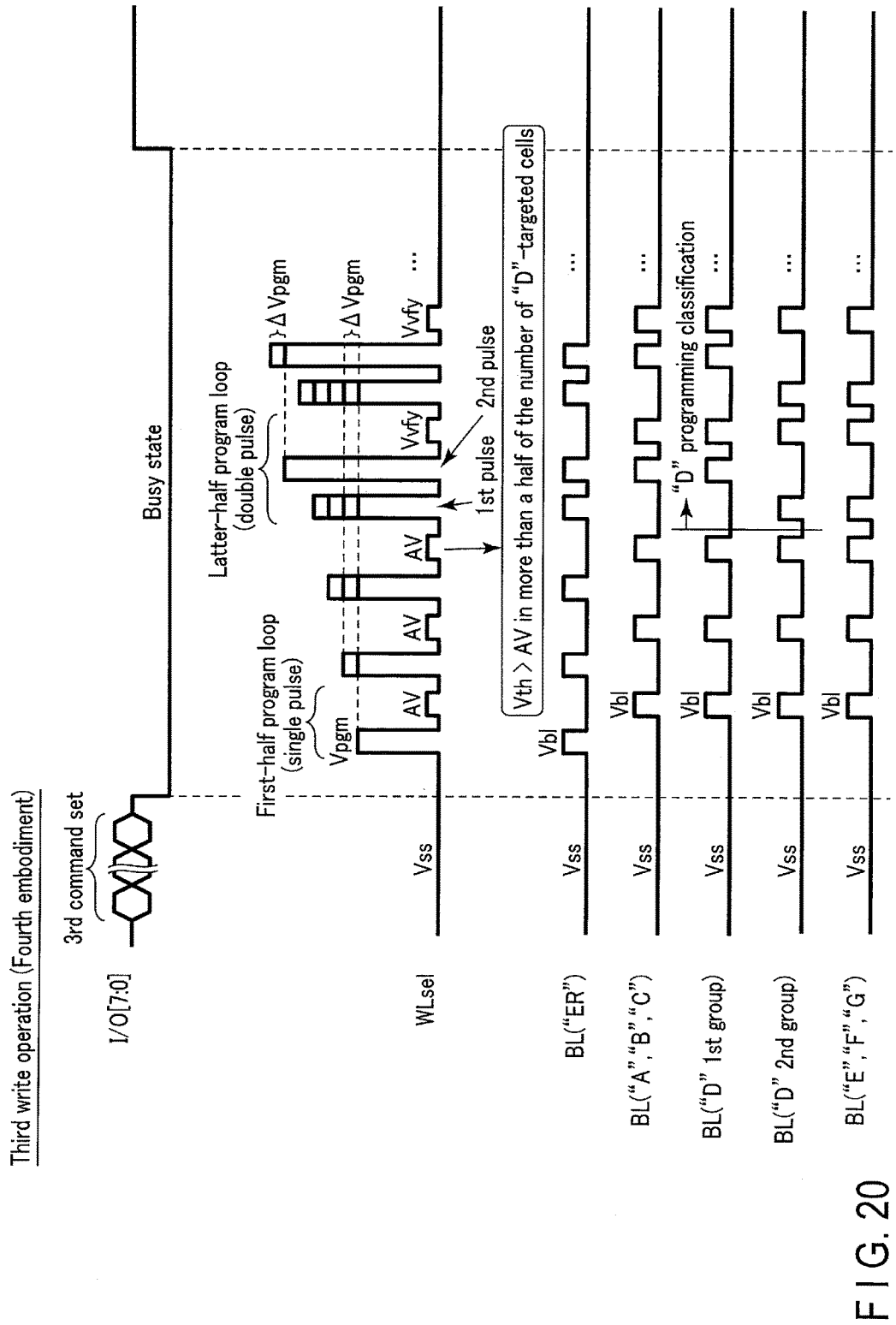
FIG. 20 is a diagram showing an example of voltages to be applied to different lines in the semiconductor memory in a third write operation according to the fourth embodiment.

FIG. 20 shows an example of a state of the input/output signal I/O, a voltage of a selected word line WLsel, and voltages of bit lines BL corresponding to programs for each level in the semiconductor memory 10 in a third write operation according to the fourth embodiment. As shown in FIG. 20, the voltages applied to respective lines in a third write operation in the fourth embodiment are the same as those shown in FIG. 17, which is described with reference to the third embodiment, except for application of a verify voltage DIV for a classifying verification operation.

Specifically, first-half program loops including single-pulse program operations are iteratively executed. For example, if first-half program loops are executed three times, in the third-time first-half program loop, the sequencer 14 detects an excess of the number of the cells of which the threshold voltage Vth exceeds the verify voltage AV over or equal to a half of the memory cell transistors MT to be programmed to the "D" level.

The sequencer 14 then classifies the memory cell transistors MT to be programmed to the "D" level into the first group and the second group, based on a result of verification using the verify voltage AV. The sequencer 14 then proceeds to the latter-half program loop, which is explained in the third embodiment. Since the other operations in the semiconductor memory 10 according to the fourth embodiment are the same as those in the semiconductor memory 10 as described in the third embodiment, a detailed description of the operations is omitted.

Even in the semiconductor memory 10 according to the fourth embodiment, the number of times of applying a program pulse to a selected word line WLsel within a latter-half program loop is greater than the number of times of applying a program pulse to a selected word line WLsel within a first-half program loop. The first-half program loop includes a verification operation for determining whether writing data for the "A" level is finished or not in selected memory cells after applying a program pulse to a selected word line WLsel.

The above-described group classification in a third write operation in the semiconductor memory 10 according to the fourth embodiment can be restated as in the following.

For example, the semiconductor memory 10 counts the number of the memory cell transistors MT that have passed verification at the "A" level in the first-half program loop. If the result exceeds the predetermined number, the sequencer 14 classifies a plurality of memory cell transistors MT written to the "D" level into multiple subgroups.

Specifically, the sequencer 14 first associates a plurality of memory cell transistors MT to which data of the "A" level, the "B" level, and the "C" level should be respectively written with a first group, and associates a plurality of memory cell transistors MT to which data of the "E" level, the "F" level, and the "G" level should be respectively written with a second group.

The sequencer 14 then associates one subgroup of the memory cell transistors MT to which data of the "D" level should be written with the first group, and another subgroup of the memory cell transistors MT to which data of the "D" level should be written with the second group.

Subsequently, the sequencer 14 executes programming using a first pulse on the first group of the memory cell transistors MT, and programming using a second pulse on the second group of the memory cell transistors MT.

[4-2] Advantageous Effects of Fourth Embodiment

As described above, in a full-sequence write operation as described in the third embodiment, in the semiconductor memory 10 according to the fourth embodiment, application of a verify voltage DIV for a classifying verification operation is omitted. Furthermore, in the semiconductor memory 10 according to the fourth embodiment, the memory cells to be programmed to the "D" level are classified into the first group with high threshold voltages and the second group with low threshold voltages, using a verification operation at the "A" level included in the program loop, and the semiconductor memory 10 proceeds from a single-pulse program operation to a double-pulse program operation.

Figure 21:
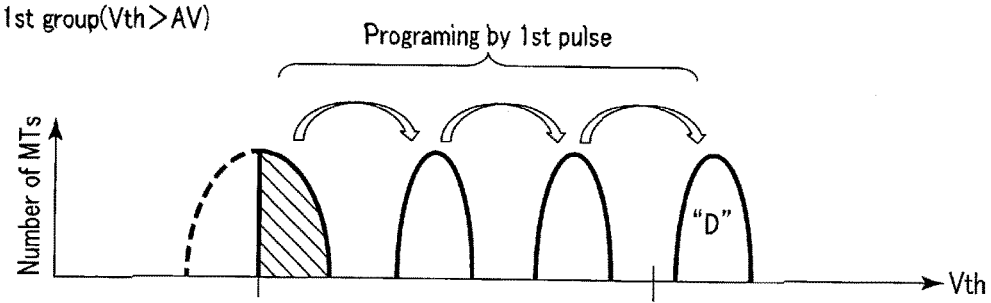
FIG. 21 is a diagram showing an example of evolution of threshold voltages of memory cell transistors targeted for "D"-level programming in a third write operation of the semiconductor memory according to the fourth embodiment.
Figure 21:
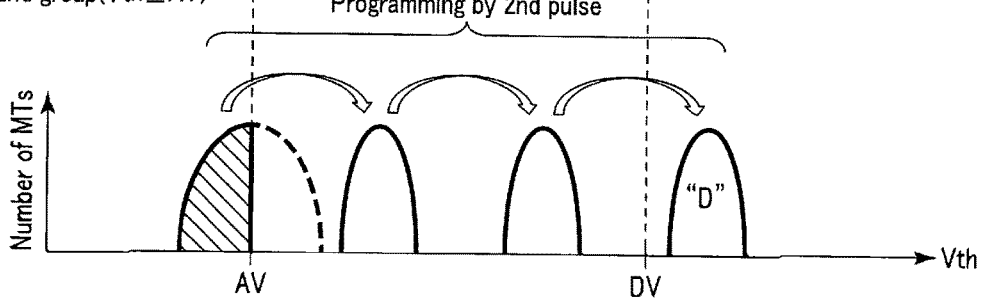

FIG. 21 shows an example of evolution of the threshold voltages in the memory cells programmed to be the "D" level in a third write operation of the fourth embodiment. As shown in FIG. 21, the semiconductor memory 10 according to the fourth embodiment classifies the memory cells to be programmed to the "D" level into groups, using a verify voltage AV as a reference, and executes program operations using different program pulses.

Specifically, as shown in FIG. 21 (1), the semiconductor memory 10 executes programming on the first group of the "D"-level memory cells by a first pulse in a third write operation. The "D"-level memory cells in the first group have threshold voltages higher than the verify voltage AV at the time of transition from a single-pulse scheme to a double pulse scheme. As shown in FIG. 21 (2), in a third write operation, the semiconductor memory 10 executes programming on the second group of the "D"-level memory cells. The "D"-level memory cells in the second group have threshold voltages lower than or equal to the verify voltage AV at the time of transition from a single-pulse scheme to a double-pulse scheme. As shown in FIGS. 21 (1) and (2), the step width of the threshold voltage increase caused by a first pulse is smaller than a second pulse.

Thus, in the memory cells to be programmed to the "D" level, the semiconductor memory 10 according to the fourth embodiment can adjust the timings when the programming by a first pulse and a second pulse is finished to be the same. In a double-pulse program operation, similar to the third embodiment, the semiconductor memory 10 according to the fourth embodiment can adjust the number of levels to be programmed by a first pulse and the number of levels to be programmed by a second pulse to be the same.

As described above, in a full-sequence write operation, the semiconductor memory 10 according to the fourth embodiment can execute a double-pulse program operation in which the "D"-level memory cell transistors MT are classified similarly to the third embodiment.

Thus, in a case where a double-pulse program operation is adopted in the middle of a write operation, the semiconductor memory 10 according to the fourth embodiment can suppress an influence of disturbance caused by a program pulse after finishing a program by another program pulse. Thus, the semiconductor memory 10 in the fourth embodiment can improve reliability of data stored in the memory cells, similar to the third embodiment.

In the above explanation, in step S40 shown in FIG. 19, the number of the memory cell transistors MT of which a threshold voltage Vth exceeds a verify voltage AV among the memory cell transistors MT to be programmed to the "D" level, is counted and used as a determination value in step S41; however, the embodiment is not limited thereto.

For example, the sequencer 14 may refer to a result of the A-level verification in all the memory cell transistors MT targeted for a write operation in step S40. In this case, in step S41, the sequencer 14 determines whether the number of the memory cell transistors MT of which the threshold voltage Vth exceeds a verify voltage AV becomes greater than the half of all the memory cell transistors MT, and proceeds to step S42 based on a result of the determination. Thus, a type of memory cells used for the counting and determination in step S40 and step S41 may be suitably changed.

[5] Modifications etc.

A semiconductor memory of an embodiment (10 in FIG. 1) includes a plurality of memory cells, a word line, a plurality of bit lines, and a controller (14 in FIG. 1). Each of the plurality of memory cells stores data of multiple bits based on a threshold voltage. If first data <e.g., "A" level in FIG. 4> is stored as multiple-bit data, the plurality of memory cells are configured to have a first threshold voltage, if second data <e.g., "D" level in FIG. 4> stored as multiple-bit data, the memory cells are configured to have a second threshold voltage higher than the first threshold voltage, and if third data <e.g., "G" level in FIG. 4> is stored as multiple-bit data, the memory cells are configured to have a third threshold voltage higher than the second threshold voltage. A word line is coupled to a plurality of memory cells. The plurality of bit lines are respectively coupled to the plurality of memory cells. The controller executes a first write, and classifies a plurality of memory cells to which the second data should be written into a plurality of subgroups in accordance with a result of the first write, and after the classification, the controller executes a second write that includes a first program loop. When the second write is executed, the controller associates a plurality of memory cells to which the first data should be written with a first group of memory cells; a plurality of memory cells to which the third data should be written with a second group of memory cells; the memory cells classified into one of the plurality of subgroups among the plurality of memory cells to which the second data should be written with the first group of memory cells; and the memory cells classified into another subgroup among the plurality of memory cells to which the second data should be written with the second group of the memory cells. The controller applies a first program pulse <e.g., a first pulse in FIG. 8> and a second program pulse <e.g., a second pulse in FIG. 8> to the word line in a first program loop of one time, applies, while the first program pulse is being applied, a first voltage to bit lines coupled to the memory cells of the first group, applies, while the second program pulse is being applied, a second voltage which is higher than the first voltage to the bit lines coupled to the memory cells of the first group, and the first voltage to bit lines coupled to the memory cells of the second group. Thus, the reliability of data stored in the semiconductor memory can be improved.

Described in the first, third, and fourth embodiments is an example of a case where the memory cells that are program-enabled by a second pulse are set to program-disabled at the time of a program operation using a first pulse in a double-pulse program operation; however, the embodiments are not limited thereto. Furthermore, in the second embodiment, in a triple-pulse program operation, the memory cells that are program-enabled by second and third pulses are set to program-disabled during a program operation using a first pulse, and the memory cells that are program-enabled by first and third pulses are set to program-disabled during a program operation using a second pulse; however, the second embodiment is not limited to this example.

For example, in a double-pulse write operation, the sequencer 14 may set the memory cells that are program-enabled by a second pulse to program-enabled during a program operation using a first pulse. Furthermore, in a triple-pulse write operation, the sequencer 14 may set the memory cells that are program-enabled by a second pulse to program-enabled during a program operation using a first pulse, or may set the memory cells that are program-enabled by a third pulse to program-enabled during a program operation using first and second pulses.

Figure 22:
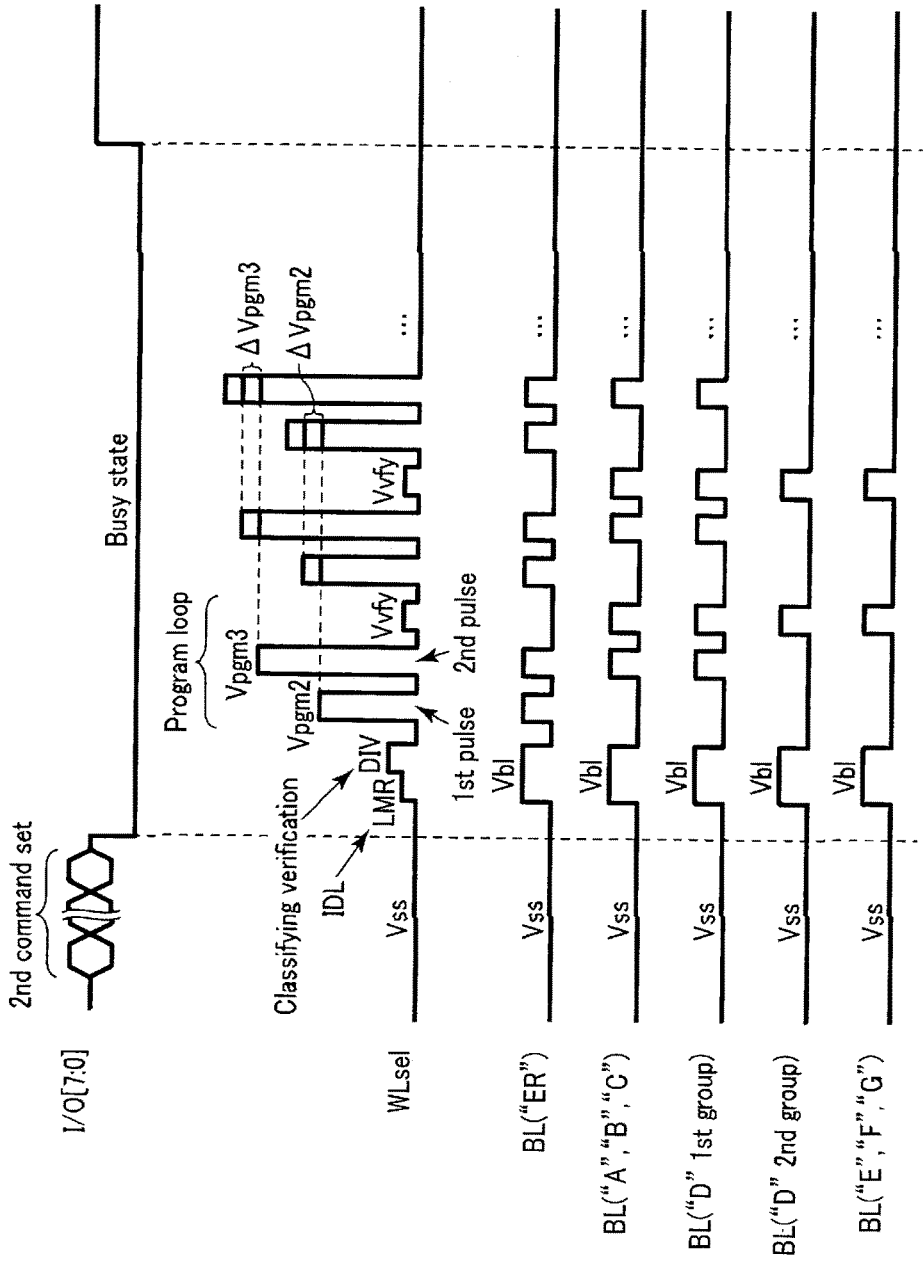
FIG. 22 is a diagram showing an example of voltages to be applied to different lines in the semiconductor memory in a second write operation according to a modification of the first embodiment.

FIG. 22 shows an example of voltages to be applied to the respective lines in a second write operation in the modification of the first embodiment, except for the voltage of the bit line BL at the time of applying a first pulse during a second write operation, compared to that in the first embodiment described with reference to FIG. 8. Specifically, when a first pulse is applied as shown in FIG. 22, the sense amplifier module 17 applies a voltage Vss to a bit line BL corresponding to the second group of the memory cell transistors MT to be programmed to the "D" level, and to bit lines BL corresponding to the memory cell transistors MT to be programmed to the "E" level, the "F" level, and the "G" level. Since the other operations in a second write operation in the modification of the first embodiment are the same as those in the second write operation described with reference to FIG. 8, a detailed description of the operations is omitted.

Figure 23:
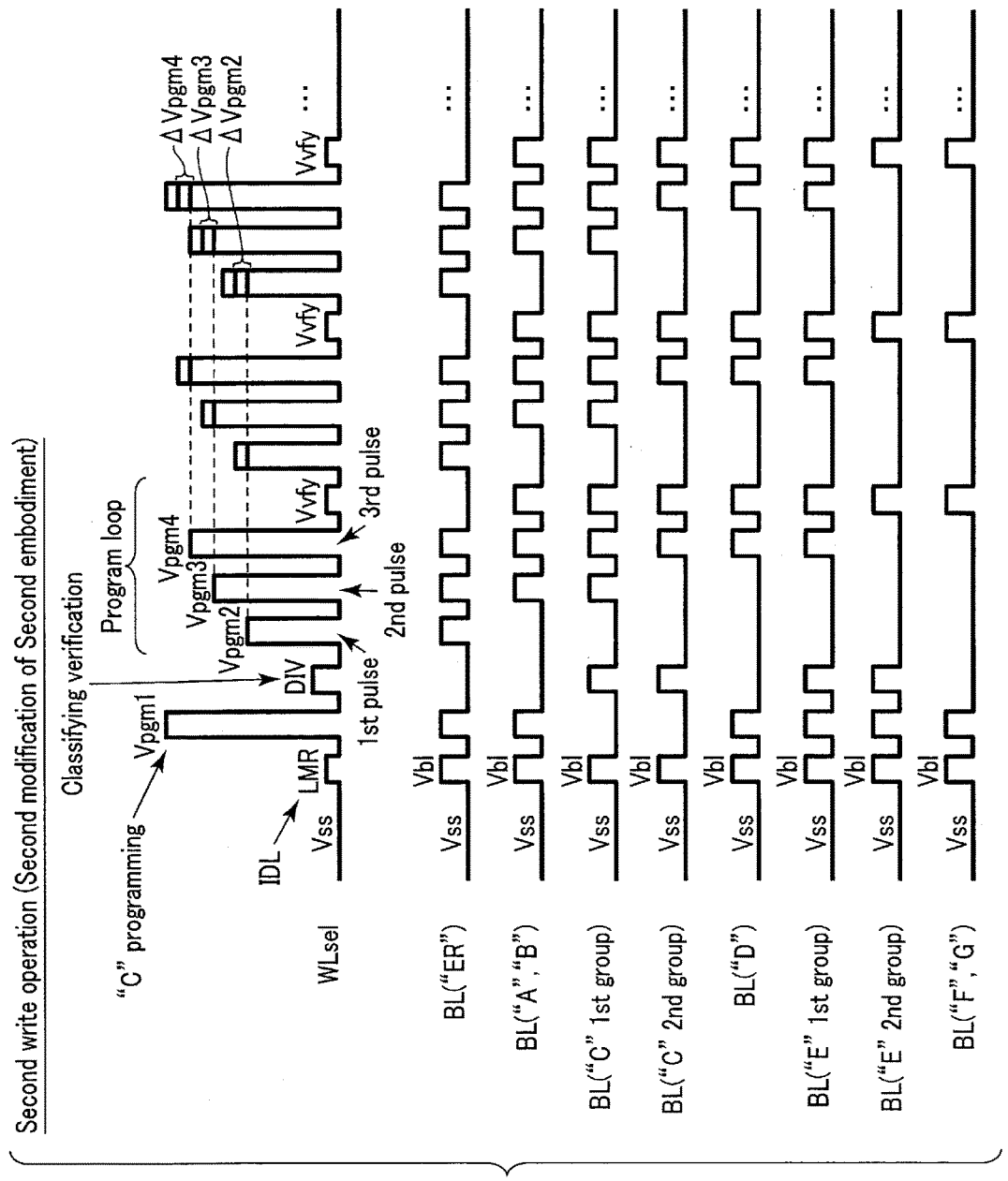
FIG. 23 is a diagram showing an example of voltages to be applied to different lines in the semiconductor memory in a second write operation according to a second modification of the second embodiment.

FIG. 23 shows an example of voltages to be applied to the respective lines in a second write operation in the second modification of the second embodiment, except for the voltage of the bit line BL at the time of applying a first pulse and the voltage of the bit line BL at the time of applying a second pulse during a second write operation, compared to the second write operation in the second embodiment described with reference to FIG. 12. Specifically, when a first pulse is applied as shown in FIG. 23, the sense amplifier module 17 applies a voltage Vss to a bit line BL corresponding to the second group of the memory cell transistors MT to be programmed to the "C" level, and to bit lines BL corresponding to the memory cell transistors MT to be programmed to the "D" level, the "E" level, the "F" level, and the "G" level. When a second pulse is applied, a voltage Vss is applied to a bit line BL corresponding to the second group of the memory cell transistors MT to be programmed to the "E" level, and to bit lines BL corresponding to the memory cell transistors MT to be programmed to the "F" level and the "G" level. Since the other operations in a second write operation in the second modification of the second embodiment are the same as the second write operation described with reference to FIG. 12, a detailed description of the operations is omitted. The above operation in the second modification of the second embodiment may be applied to the first modification of the second embodiment.

Figure 24:
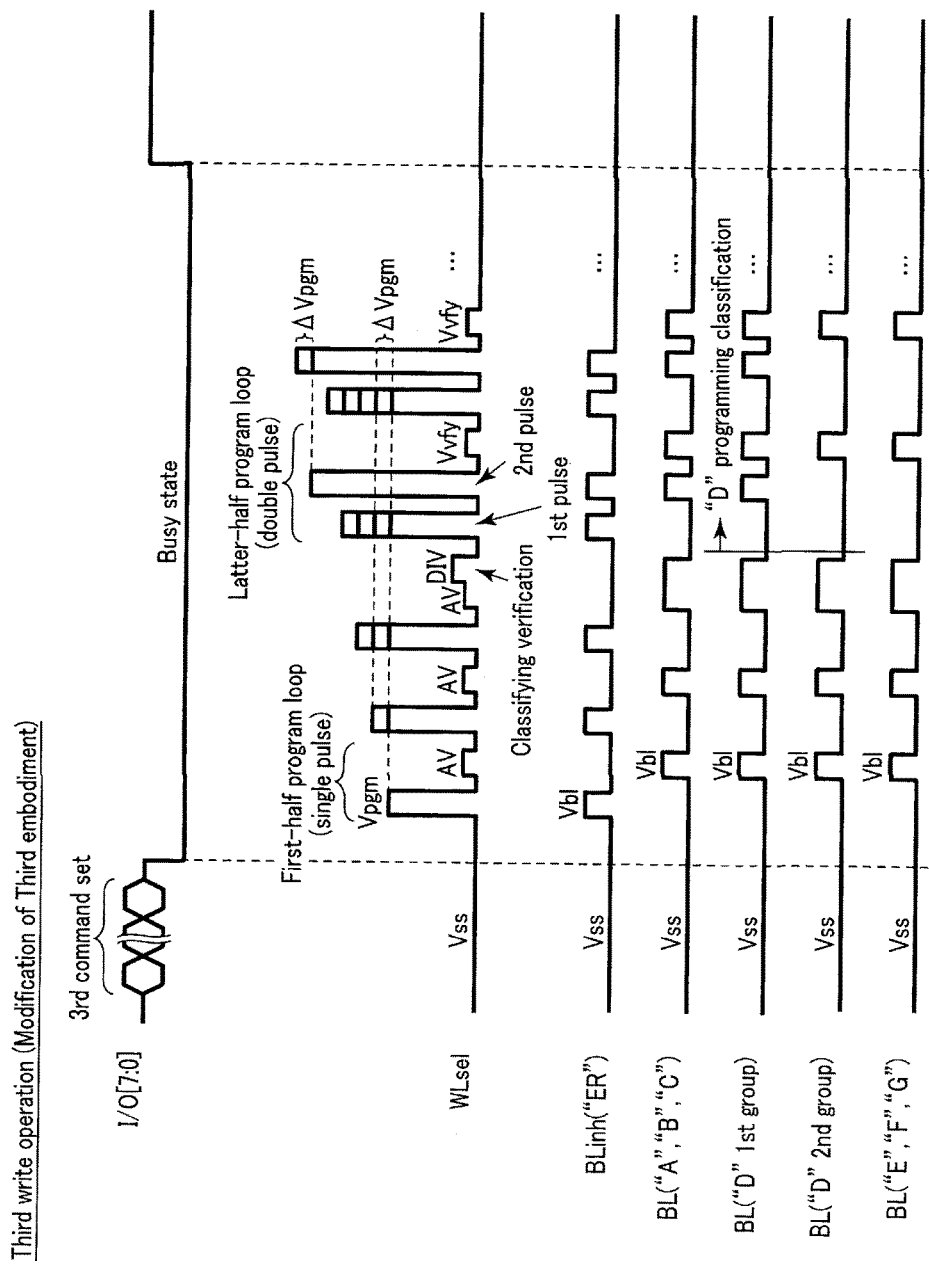
FIG. 24 is a diagram showing an example of voltages to be applied to different lines in the semiconductor memory in a third write operation according to a modification of the third embodiment.

FIG. 24 shows an example of voltages to be applied to the respective lines in a third write operation in the modification of the third embodiment, except for the voltage of the bit line BL at the time of applying a first pulse, compared to that in a third write operation in the third embodiment described with reference to FIG. 17. Specifically, when a first pulse is applied as shown in FIG. 24, the sense amplifier module 17 applies a voltage Vss to a bit line BL corresponding to the second group of the memory cell transistors MT to be programmed to the "D" level, and to bit lines BL corresponding to the memory cell transistors MT to be programmed to the "E" level, the "F" level, and the "G" level. Since the other operations in a third write operation in the modification of the third embodiment are the same as those in the third write operation described with reference to FIG. 17, a detailed description of the operations is omitted.

Figure 25:
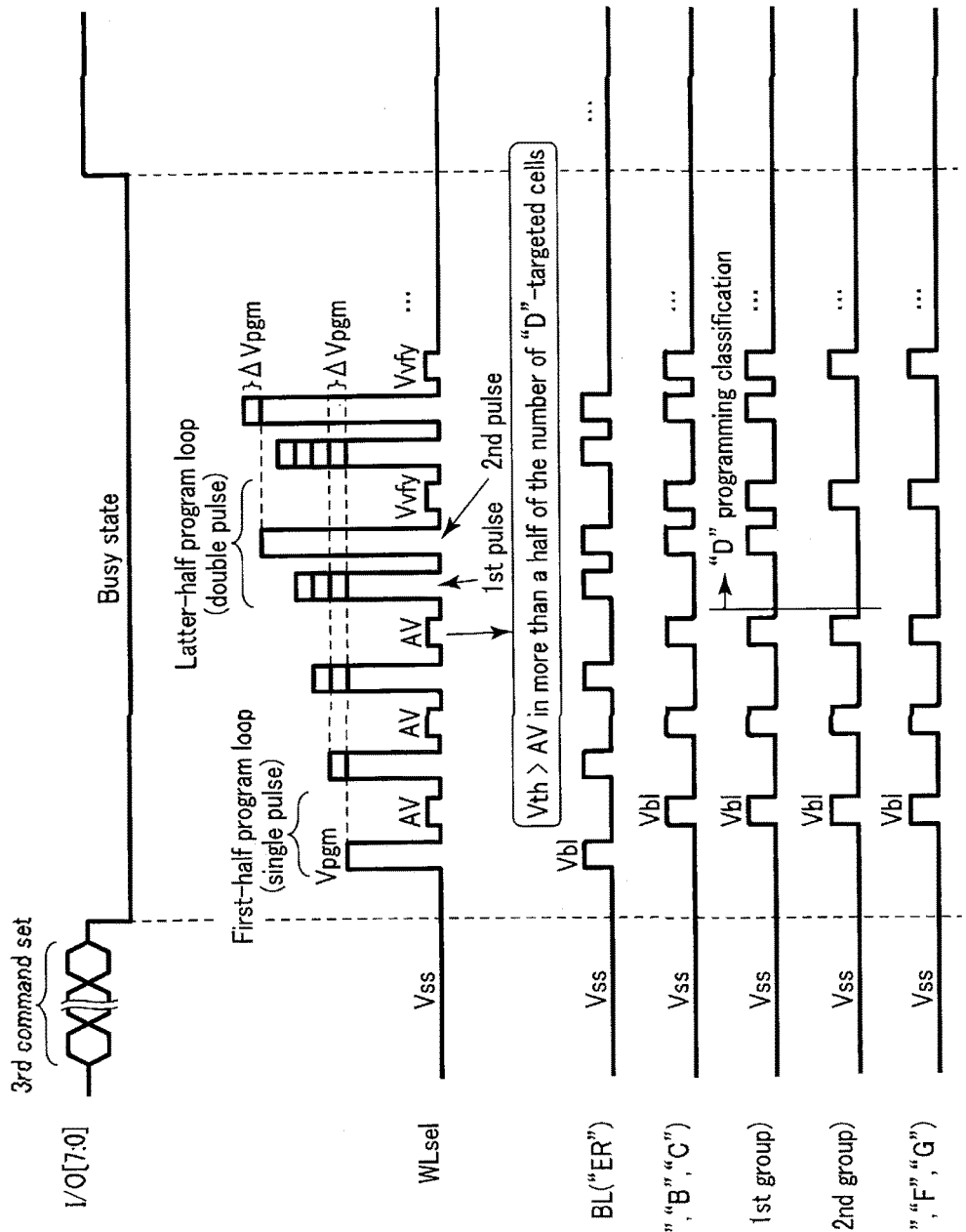
FIG. 25 is a diagram showing an example of voltages to be applied to different lines in the semiconductor memory in a third write operation according to a modification of the fourth embodiment.

FIG. 25 shows an example of voltages to be applied to the respective lines in a third write operation in the modification of the fourth embodiment, except for the voltage of the bit line BL at the time of applying a first pulse, compared to that in a third write operation in the fourth embodiment described with reference to FIG. 20. Specifically, when a first pulse is applied as shown in FIG. 25, the sense amplifier module 17 applies a voltage Vss to a bit line BL corresponding to the second group of the memory cell transistors MT to be programmed to the "D" level, and to bit lines BL corresponding to the memory cell transistors MT to be programmed to the "E" level, the "F" level, and the "G" level. Since the other operations in a third write operation in the modification of the fourth embodiment are the same as those in the third write operation described with reference to FIG. 20, a detailed description of the operations is omitted.

Described in the above embodiments is a case where the sense amplifier module 17 applies a ground voltage Vss to program-disabled bit lines BL and bit lines corresponding to the memory cells that are not verification-targeted during a verification operation, while a verify voltage is being applied to a selected word line WLsel; however, the embodiments are not limited thereto. For example, the sense amplifier module 17 may apply a voltage Vbl to program-disabled bit lines BL and bit lines corresponding to the memory cells that are not verification-targeted while each verify voltage is being applied.

In the third and fourth embodiments, an example where a TLC scheme is adopted as a write scheme is described; however, the embodiments are not limited thereto. For the semiconductor memory 10 according to the third and fourth embodiments, a QLC scheme may be adopted for example. In such cases, memory cells that are targeted for group classification may be discretionarily set in the middle of a third write operation, thereby achieving advantageous effects similar to those of the third and fourth embodiments. For example, as described in the first embodiment, the memory cells to be programmed to the "H" level may be classified into groups, and a double-pulse program operation in which a different program pulse is applied to each of the classified groups may be executed.

In the third and fourth embodiments, an example where a double-pulse program operation is adopted is described; however, the embodiments are not limited thereto. For the semiconductor memory 10 according to the third and fourth embodiments, a triple-pulse scheme may be adopted for example. In such cases, memory cells that are targeted for group classification may be set in the middle of a third write operation, similar to the second embodiment, thereby achieving advantageous effects similar to those of the third and fourth embodiments. For example, as described in the second embodiment, the memory cells to be programmed to the "C" level and the "E" level are classified into groups in a classifying verification operation. Similarly to the triple-pulse program operation described in the second embodiment, a different program pulse is applied to each group classified at the "C" level, and a different program pulse is applied to each group classified at the "E" level. Thus, the semiconductor memory 10 according to the third and fourth embodiments in which a triple-pulse scheme is adopted can achieve advantageous effects similar to those achieved in the second embodiment.

In the above-described embodiments, the first to third write operations are described using a waveform of a word line WL; however, a waveform of a corresponding signal line CG has a waveform similar to that of the word line WL. In other words, a voltage to be applied to a word line WL and a period during which a voltage is to be applied to a word line WL can be roughly known by checking a voltage of a signal line CG corresponding to the word line WL. An influence of a voltage drop caused by the transistor TR may appear between a voltage of a word line WL and a voltage of a signal line CG.

The configuration of the memory cell array 11 in the above-described embodiments maybe a different configuration. As for the other configurations in the memory cell array 11, they are described in, for example, U.S. patent application Ser. No. 12/407,403 filed on Mar. 19, 2009 and entitled "THREE-DIMENSIONALLY STACKED NONVOLATILE SEMICONDUCTOR MEMORY," U.S. patent application Ser. No. 12/406,524 filed on Mar. 18, 2009 and entitled "THREE-DIMENSIONALLY STACKED NON-VOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND MANUFACTURING METHOD THEREOF" are applied. The entire contents of these applications are incorporated herein by reference.

The block BLK is, for example, an erase unit of data in the three-dimensional semiconductor memory device, but is not limited thereto. Other erase operations are described in U.S. patent application Ser. No. 13/235,389 entitled "Nonvolatile semiconductor memory device" filed on Sep. 18, 2011, and in U.S. patent application Ser. No. 12/694,690 entitled "Non-volatile semiconductor memory device" filed on Jan. 27, 2010. These patent applications are incorporated by reference herein in their entirety.

In the present description, the term "coupled" means an electrical coupling, and does not exclude a coupling with an element being interposed in the coupling, for example. In the present description, the term "cutoff" means an OFF state of a transistor, and does not exclude a flow of a weak current, such as a leak current in a transistor.

In the embodiments according to the present invention:

(1) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line to write data in an odd word line, and the voltage first applied to the selected word line to write data in an even word line may be changed.

When the program operation is an incremental step pulse program (ISPP) type, a step-up voltage is, for example, about 0.5 V.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(2) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, or 19.8 V to 21 V.

The time (tErase) for the erase operation may be, for example, 3000 μs to 4000 μs, 4000 μs to 5000 μs, or 4000 μs to 9000 μs.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory comprising:
a plurality of first memory cells, each of the first memory cells storing multiple-bit data based on a threshold voltage, and if first data is stored as multiple-bit data, the plurality of first memory cells being set so as to have a first threshold voltage, if second data is stored as multiple-bit data, the plurality of first memory cells being set so as to have a second threshold voltage which is higher than the first threshold voltage, and if third data is stored as multiple-bit data, the plurality of first memory cells being set so as to have a third threshold voltage which is higher than the second threshold voltage;
a first word line coupled to the plurality of first memory cells;
a plurality of bit lines respectively coupled to the plurality of first memory cells; and
a controller configured to execute a first write, to classify the plurality of first memory cells to which the second data should be written into a plurality of subgroups in accordance with a result of the first write, and to execute a second write that includes a first program loop after the classification, wherein
when executing the second write, the controller is configured to:
associate the plurality of first memory cells to which the first data should be written with the first memory cells of a first group, the plurality of first memory cells to which the third data should be written with the first memory cells of a second group, among the plurality of first memory cells to which the second data should be written, the memory cells classified into one of the plurality of subgroups with the first memory cells of the first group, and the memory cells classified into another subgroup with the first memory cells of the second group;
apply a first program pulse and a second program pulse to the first word line in the first program loop of one time;
apply a first voltage to bit lines coupled to the first memory cells of the first group while the first program pulse is being applied; and
apply a second voltage higher than the first voltage to the bit lines coupled to the first memory cells of the first group and applies the first voltage to bit lines coupled to the first memory cells of the second group while the second program pulse is being applied.

2. The semiconductor memory of claim 1, wherein the controller applies the second voltage to the bit line coupled to the first memory cells of the second group, while the first program pulse is being applied to the first word line.

3. The semiconductor memory of claim 1, wherein the controller applies the first voltage to the bit line coupled to the first memory cells of the second group, while the first program pulse is being applied to the first word line.

4. The semiconductor memory of claim 1, wherein a voltage of the first program pulse is lower than a voltage of the second program pulse.

5. The semiconductor memory of claim 1, wherein the first write includes a second program loop, and a number of times of applying a program pulse to the first word line by the controller in the first program loop of one time is greater than a number of times of applying a program pulse to the first word line in the second program loop of one time.

6. The semiconductor memory of claim 1, wherein the controller executes the first write upon receiving first page data from an external device to write the first page data to the plurality of first memory cells, and executes, upon further receiving second page data from the external device, the second write to write multiple-bit data that is based on the first page data and the second page data to the plurality of first memory cells.

7. The semiconductor memory of claim 6, further comprising:
a plurality of second memory cells, each of the second memory cells storing multiple-bit data based on a threshold voltage; and
a second word line coupled to the plurality of second memory cells, wherein
third page data is received after receiving the first page data and before receiving the second page data by the controller, and
the controller writes the received third page data to the plurality of second memory cells.

8. The semiconductor memory of claim 6, wherein the controller executes a verification operation on the plurality of first memory cells after writing the first page data, and
the controller classifies the plurality of first memory cells into the plurality of subgroups based on a result of the verification operation.

9. The semiconductor memory of claim 8, wherein upon receiving the second page data, the controller reads the first page data from the plurality of first memory cells, and
the multiple-bit data to be written to the plurality of first memory cells in the second write is based on the first page data that is read by the controller and the second page data that is received by the controller.

10. The semiconductor memory of claim 9, wherein the controller applies a third voltage lower than the second threshold voltage to the first word line in the verification operation, and applies a fourth voltage lower than the third voltage to the first word line when the first page data is read.

11. The semiconductor memory of claim 6, wherein
the first page data includes one bit of data corresponding to each of the plurality of first memory cells, and
the second page data includes multiple bits of data corresponding to each of the plurality of first memory cells.

12. The semiconductor memory of claim 1, wherein
the plurality of first memory cells are set to have a fourth threshold voltage that is lower than the first threshold voltage if fourth data is stored as multiple-bit data, and are set to have a fifth threshold voltage that is lower than the fourth threshold voltage if fifth data is stored as multiple-bit data,
the controller executes a third write after the first write and before the classification, and classifies the plurality of first memory cells to which the fourth data should be written into a plurality of subgroups in accordance with a result of the third write, and
when executing the second write, the controller is configured to:
associate the plurality of first memory cells to which the fifth data should be written with the first memory cells of a third group, among the plurality of first memory cells to which the fourth data should be written, the first memory cells classified into one of the plurality of subgroups with the first memory cells of the third group, and the first memory cells classified into another subgroup with the first memory cells of the first group;
further apply a third program pulse to the first word line in the first program loop of one time;
apply the first voltage to bit lines coupled to the first memory cells of the third group while the third program pulse is being applied; and
apply the second voltage to the bit lines coupled to the first memory cells of the third group while the first program pulse is being applied.

13. The semiconductor memory of claim 12, wherein
a voltage of the first program pulse is lower than a voltage of the second program pulse and higher than a voltage of the third program pulse.

14. The semiconductor memory of claim 1, wherein
the first write includes a second program loop in which a verification operation is executed to determine whether or not writing of the first data to the first memory cells is completed after applying a program pulse to the first word line, a number of times of applying a program pulse to the first word line in the second program loop being smaller than that in the first program loop, and
if a number of the first memory cells that have passed the verification operation executed in the second program loop exceeds a predetermined number, the controller classifies the plurality of first memory cells to which the second data should be written into a plurality of subgroups, and proceeds to the second write.

15. A semiconductor memory comprising:
a plurality of first memory cells, each of the first memory cells storing multiple-bit data based on a threshold voltage;
a first word line coupled to the plurality of first memory cells; and
a controller configured to execute a first write upon receiving first page data from an external device to write the first page data to the plurality of first memory cells, and to execute, upon further receiving second page data from the external device, a second write including a program loop for applying a plurality of program pulses having different voltage values to the first word line, and that executes a write operation in which multiple-bit data is written to the plurality of first memory cells based on the second page data and the first page data, wherein
the controller applies, to the first word line, after receiving the second page data and before executing the second write, a read voltage capable of reading the first page data that is written to the plurality of first memory cells by the first write, and a certain voltage higher than the read voltage and lower than a voltage of the plurality of program pulses.

16. The semiconductor memory of claim 15, wherein
the first write includes a program loop in which the controller applies a program pulse and a verify voltage to the first word line, and
the verify voltage is higher than the read voltage and lower than the certain voltage.

17. The semiconductor memory of claim 15, wherein
the first page data includes one bit of data corresponding to each of the plurality of first memory cells,
and the second page data includes multiple bits of data corresponding to each of the plurality of first memory cells.

18. A semiconductor memory comprising:
a plurality of first memory cells, each of the first memory cells storing multiple-bit data based on a threshold voltage, and if first data is stored as multiple-bit data, the plurality of first memory cells being set so as to have a first threshold voltage, if second data is stored as multiple-bit data, the plurality of first memory cells being set so as to have a second threshold voltage higher than the first threshold voltage, and if third data is stored as multiple-bit data, the plurality of first memory cells being set so as to have a third threshold voltage higher than the second threshold voltage;
a first word line coupled to the plurality of first memory cells; and
a plurality of bit lines respectively coupled to the plurality of first memory cells;
a controller configured to execute a write operation in which multiple-bit data is written to the plurality of first memory cells, the write operation including:
executing a first write upon receiving first page data from an external device to write the first page data to the plurality of first memory cells;
reading, upon further receiving second page data from the external device, the first page data from the plurality of first memory cells by applying a read voltage to the first word line;
monitoring threshold voltage distributions after the first write in the plurality of first memory cells to which the second data should be written by applying a certain voltage that is higher than the read voltage to the first word line;
classifying the plurality of first memory cells to which the second data should be written into a plurality of subgroups in accordance with a result of the monitoring; and
executing a second write including a first program loop after the classification to write, to the plurality of first memory cells, multiple-bit data based on the first page data that is read and the second page data that is received, wherein when executing the second write, the controller is configured to:

associate, among the plurality of first memory cells to which the second data should be written, the first memory cells classified into one of the plurality of subgroups with the first memory cells of a first group, and the first memory cells classified into another subgroup with the first memory cells of a second group;

apply a first program pulse and a second program pulse to the first word line in the first program loop of one time;

apply a first voltage to bit lines coupled to the first memory cells of the first group while the first program pulse is being applied; and apply a second voltage higher than the first voltage to the bit lines coupled to the first memory cells of the first group, and applies the first voltage to bit lines coupled to the first memory cells of the second group while the second program pulse is being applied.

19. The semiconductor memory of claim 18, further comprising:

a plurality of second memory cells, each of the second memory cells storing multiple-bit data based on a threshold voltage; and a second word line coupled to the plurality of second memory cells, wherein third page data is received after receiving the first page data and before receiving the second page data by the controller, and the controller writes the received third page data to the plurality of second memory cells.

20. The semiconductor memory of claim 18, wherein the first page data includes one bit of data corresponding to each of the plurality of first memory cells, and the second page data includes multiple bits of data corresponding to each of the plurality of first memory cells.

* * * * *